United States Patent
Veskovic

(10) Patent No.: US 11,817,856 B2
(45) Date of Patent: Nov. 14, 2023

(54) LOAD CONTROL DEVICE HAVING A CAPACITIVE TOUCH SURFACE

(71) Applicant: Lutron Technology Company LLC, Coopersburg, PA (US)

(72) Inventor: Dragan Veskovic, Allentown, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 17/508,103

(22) Filed: Oct. 22, 2021

(65) Prior Publication Data

US 2022/0131540 A1 Apr. 28, 2022

Related U.S. Application Data

(60) Provisional application No. 63/104,321, filed on Oct. 22, 2020.

(51) Int. Cl.
*H03K 17/96* (2006.01)
*H01H 3/02* (2006.01)
(Continued)

(52) U.S. Cl.
CPC ............. *H03K 17/962* (2013.01); *H01H 3/02* (2013.01); *H01H 23/145* (2013.01);
(Continued)

(58) Field of Classification Search
CPC ......... H01H 2300/03; H01H 2300/032; H01H 23/00; H01H 2003/00; H01H 2003/02; H01H 2003/12; H01H 2021/00; H01H 2221/00; H01H 2221/008; H01H 2221/016; H01H 2221/014; H01H 2221/018; H01H 2223/01; H01H 2223/014; H01H 2223/024; H01H 2223/028; H01H 2231/016; H01H 2231/03; H01H 2231/052; H01H 2239/074; H01H 2003/0293; H01H 2215/00; H01H 3/00; H01H 3/02; H01H 3/12; H01H 3/14; H01H 13/00; H01H 13/04; H01H 13/06;
(Continued)

(56) References Cited

U.S. PATENT DOCUMENTS 5,905,442 A 5/1999 Mosebrook et al.
5,982,103 A 11/1999 Mosebrook et al.
(Continued)

*Primary Examiner* — Anthony R Jimenez
(74) *Attorney, Agent, or Firm* — Flaster Greenberg, P.C.

(57) ABSTRACT

A control device configured for use in a load control system to control one or more electrical loads external to the control device may include an antenna and an actuation member having a front surface defining a touch sensitive surface configured to detect a touch actuation along at least a portion of the front surface. The control device may include a main printed circuit board (PCB) comprising a control circuit, an antenna PCB connected to the main PCB, a tactile switch (es), a controllably conductive device, and a drive circuit operatively coupled to a control input of the controllably conductive device for rendering the controllably conductive device conductive or non-conductive to control the amount of power delivered to the electrical load. The antenna may extend substantially perpendicular from the main PCB through an opening in the yoke and into a cavity defined by the actuation member and the yoke.

28 Claims, 11 Drawing Sheets

(51) Int. Cl.
  *H01H 23/14* (2006.01)
  *H05B 39/08* (2006.01)

(52) U.S. Cl.
  CPC ... *H05B 39/085* (2013.01); *H01H 2003/0293* (2013.01); *H01H 2215/00* (2013.01)

(58) Field of Classification Search
  CPC ........ H01H 13/12; H01H 13/14; H01H 13/68; H01H 21/00; H01H 21/04; H01H 21/08; H01H 23/145; H05B 39/085; H03K 17/962
  USPC .................................. 200/600, 5 A
  See application file for complete search history.

(56) References Cited

U.S. PATENT DOCUMENTS

| | | |
|---|---|---|
| 7,106,261 B2 | 9/2006 | Nagel et al. |
| 7,190,125 B2 | 3/2007 | McDonough et al. |
| 7,242,150 B2 | 7/2007 | DeJonge et al. |
| 7,358,927 B2 | 4/2008 | Luebke et al. |
| 7,362,285 B2 | 4/2008 | Webb et al. |
| 7,546,473 B2 | 6/2009 | Newman et al. |
| 7,573,208 B2 | 8/2009 | Newman et al. |
| 7,592,967 B2 | 9/2009 | Mosebrook et al. |
| 7,714,790 B1 | 5/2010 | Feldstein et al. |
| 7,756,556 B2 | 7/2010 | Patel et al. |
| 8,089,414 B2 | 1/2012 | Feldstein et al. |
| 8,330,638 B2 | 12/2012 | Altonen et al. |
| 8,664,881 B2 | 3/2014 | Salvestrini et al. |
| 10,109,181 B2 | 10/2018 | Dimberg et al. |
| 10,847,174 B2 * | 11/2020 | Monteith ................ G10L 15/22 |
| 11,303,125 B2 | 4/2022 | Bollinger et al. |
| 2009/0102677 A1 * | 4/2009 | Patel ...................... H01H 23/16 340/693.5 |
| 2017/0257927 A1 | 9/2017 | Camden et al. |
| 2019/0394861 A1 | 12/2019 | Karc et al. |
| 2020/0168414 A1 | 5/2020 | Dimberg |
| 2020/0382120 A1 | 12/2020 | Brogan et al. |

* cited by examiner

LOAD CONTROL DEVICE HAVING A CAPACITIVE TOUCH SURFACE

CROSS-REFERENCE TO RELATED APPLICATIONS

This application claims the benefit of Provisional U.S. Patent Application No. 63/104,321, filed Oct. 22, 2020, the disclosure of which is incorporated herein by reference in its entirety.

BACKGROUND

A load control system may include one or more electrical loads that a user may wish to control via a single load control device. These electrical loads may include, for example, lighting loads, HVAC units, motorized window treatment or projection screens, humidity control units, audio systems or amplifiers, Internet of Things (IoT) devices, and/or the like. The electrical loads may have advanced features. For example, a lighting load may be controlled to emit light of varying intensities and/or colors in response to a user command. The amount of power delivered to the electrical loads may be adjusted to an absolute level or by a relative amount. Multiple electrical loads may be manipulated such that one or more presets or scenes (e.g., combinations of particular lighting conditions, temperature settings, speaker volume, and/or the like) may be created, and a user may desire the ability to browse through the presets or scenes, and activate one that fits a particular occasion. With a traditional load control device such as a mechanical toggle switch, a user will not be able to perform any of the aforementioned functions, let alone performing multiple of them through one device.

The insufficiencies of traditional load control devices arise at least in part from the actuation mechanism utilized in those devices. More specifically, traditional load control devices are typically only capable of responding to simple user actions such as moving a lever or pushing a button. As such, the number and/or types of control that may be applied through a load control device is limited. To meet the demand of advanced electrical loads, there is a need to employ alternative user interface technologies such as those capable of detecting human gestures and translating the gestures into control data (e.g., control signals) for controlling the electrical loads. These technologies may expand the capacity of a load control device, while at the same time enhancing its usability and aesthetic appeal, for example.

A traditional load control device may also lack the capacity to provide visual feedback to a user about the operation of the load control device and/or the electrical loads controlled by the load control devices. Such capacity is an important aspect of user experience in an advanced load control system where a user may be able to manipulate multiple operating parameters of an electrical load or to control multiple electrical loads via a single control device. Provision of feedback in those environments can keep the user informed about the state and/or mode of the control device and electrical loads, and may help the user navigate through the various functionalities of the control device.

SUMMARY

As described herein, a control device configured for use in a load control system to control one or more electrical loads external to the control device may comprise an antenna and an actuation member having a front surface defining a touch sensitive surface (e.g., capacitive touch surface) configured to detect a touch actuation (e.g., a point actuation) along at least a portion of the front surface. The control device may include a main printed circuit board (PCB) comprising a control circuit, an antenna PCB connected to the main PCB, a tactile switch(es), a controllably conductive device, and a drive circuit operatively coupled to a control input of the controllably conductive device for rendering the controllably conductive device conductive or non-conductive to control the amount of power delivered to the electrical load. The main PCB may include a counterpoise. The antenna PCB may include an antenna mounted thereto. The antenna may be a monopole antenna. The antenna may extend substantially perpendicular from the main PCB. The main PCB may include a wireless communication circuit that is coupled to the antenna for transmitting and/or receiving wireless messages that include a command for controlling one or more electrical loads. The control device may determine the command based on a user input on the actuation member.

The control device may include a yoke that is configured to attach the control device to a wallbox. The yoke may be a metal yoke. The control device may define a cavity between the actuation member and the yoke. The yoke may define an opening that is configured to receive the antenna PCB. The opening may include a first portion that is configured to receive the antenna PCB and a second portion that is configured to enable electrical connection of a capacitive touch PCB to the main PCB. The antenna may extend from a location proximate to the main PCB through the opening in the yoke and into the cavity. For example, a portion of the antenna may be located within the cavity. The antenna PCB may include one or more fingers. The main PCB may include one or more slots that are configured to receive the fingers. The antenna PCB may define one or more slots proximate to the antenna. The slots may extend from a first surface of the antenna PCB to a second surface of the antenna PCB. The antenna may be attached to the first surface of the antenna PCB.

The antenna may include a horizontal trace that extends from a front side of the yoke to a rear side of the yoke. The antenna may further include a vertical trace connected to the horizontal trace. The vertical trace may include the portion of the antenna located within the cavity. The vertical trace of the monopole antenna may define a first width and the horizontal trace of the antenna may define a second width. The first width may be greater than the second width. The antenna PCB may include a plurality of fingers that are configured to connect the antenna PCB to the main PCB. The antenna is electrically connected to the wireless communication circuit via one of the plurality of fingers. The antenna PCB may include pads on one or more of the plurality of fingers that are configured to attach the antenna PCB to the main PCB. The main PCB may include a plurality of slots configured to receive the plurality of fingers. The antenna PCB may include one or more slots proximate to the antenna. The slots may be configured to reduce an amount of board material proximate to the antenna. A first slot of the one or more slots may be located proximate to the vertical trace of the antenna and a second slot of the one or more slots may be located proximate to the horizontal trace of the antenna. The antenna may be located substantially at a midpoint between the capacitive touch printed circuit board and a bidirectional semiconductor switch of the control device. The antenna may be located outside of a capacitive touch area defined by the capacitive touch printed circuit board.

The control device may also include a capacitive touch PCB affixed to the actuation member. The capacitive touch PCB may comprise a touch sensitive circuit comprising one or more receiving capacitive touch pads located on the capacitive touch PCB, behind the actuation member, and arranged in a linear array and adjacent to the capacitive touch surface. The capacitive touch PCB may include a ground plane on a back side of the capacitive touch PCB. The actuation member may be configured to pivot about a pivot axis to actuate the tactile switch on the main PCB in response to actuations of the actuation member, such that the capacitive touch surface and the capacitive touch PCB are configured to move with the actuation member in response to actuations of the actuation member. The actuation member may additionally be configured to substantially maintain its position (e.g., not pivot about the pivot axis) in response to a user input applied over the pivot axis so that the tactile switch is not actuated by the user input. In response to such a user input, the control device may enter a programming mode to allow a user to configure or adjust the operating characteristics of the control device. The control device may also be configured to perform a specific operation (e.g., switch from an intensity control mode to a color control mode) in response to the user input.

A control device may include an actuation member, a main printed circuit board, and/or a capacitive touch printed circuit board affixed to the actuation member. The actuation member has a front surface that may define a touch sensitive surface (e.g. capacitive touch surface) that is configured to detect a touch actuation along at least a portion of the touch sensitive surface (e.g., a portion above a light bar of the control device). The main printed circuit board may include a first control circuit, a tactile switch, a controllably conductive device, and/or a drive circuit. The drive circuit is operatively coupled to a control input of the controllably conductive device for rendering the controllably conductive device conductive or non-conductive to control the amount of power delivered to the electrical load. The actuation member may be configured to pivot about a pivot axis to actuate the tactile switch on the main printed circuit board in response to tactile actuations of the actuation member. The antenna may be located proximate to the pivot axis.

The capacitive touch printed circuit board may include one or more receiving touch sensitive pads, such as capacitive touch pads, located on the capacitive touch printed circuit board. The touch sensitive pads may be located behind the actuation member and/or may be arranged in a linear array adjacent to the touch sensitive surface. The capacitive touch printed circuit board may also include a second control circuit configured to receive inputs from the capacitive touch pads and provide an output signal to the first control circuit in response to the inputs received from the capacitive touch pads. The capacitive touch printed circuit board may be configured to move with the actuation member in response to tactile actuations of the actuation member. The first control circuit may be configured to control an amount of power delivered to the electrical load in response to a position of a touch actuation along the length of the touch sensitive surface indicated by the output signal from the second control circuit.

The second control circuit may be configured to compare a measured voltage provided via a capacitive touch pad to a voltage threshold and generate an output signal that indicates when the measured voltage exceeds the voltage threshold. The second control circuit may be configured to use different voltage thresholds for different capacitive touch pads. For example, the receiving capacitive touch pads may be separated from the capacitive touch surface by varying distances, and the different voltage thresholds may be used based on the distance between the capacitive touch pad and the capacitive touch surface.

DETAILED DESCRIPTION

Figure 1:
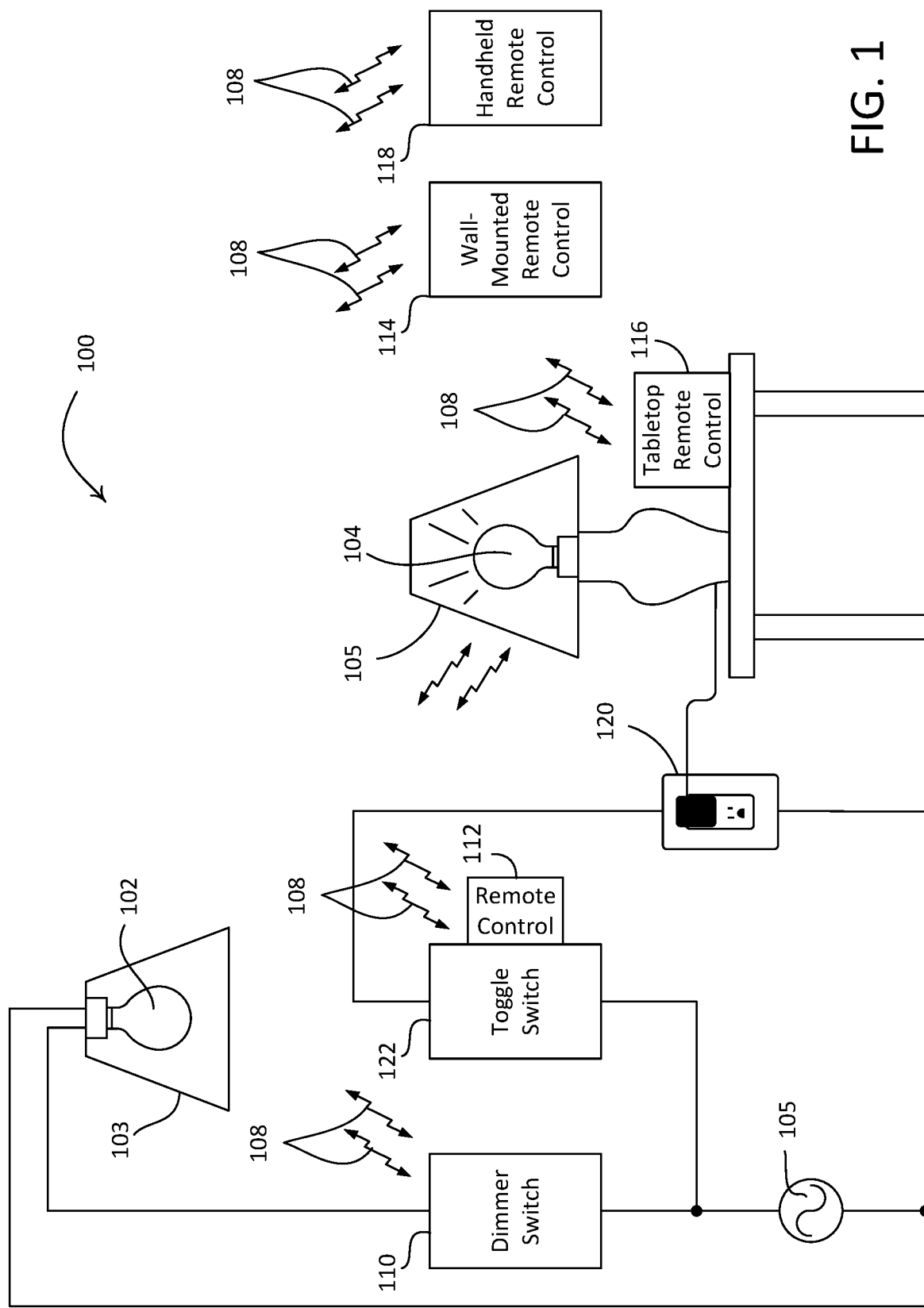
FIG. 1 depicts an example load control system that includes one or more example control devices.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command. The amount of power delivered to the lighting loads may be adjusted to an absolute level or by a relative amount. The lighting control system 100 may be configured to control one or more of the lighting loads (e.g., and/or other electrical loads) according to one or more configurable presets or scenes. These presets or scenes may correspond to, for example, predefined light intensities and/or colors, predefined entertainment settings such as music selection and/or volume settings, predefined window treatment settings such as positions of shades, predefined environmental settings such as HVAC settings, or any combination thereof. The presets or scenes may correspond to one or more specific electrical loads (e.g., bedside lamps, ceiling lights, etc.) and/or one or more specific locations (e.g., a room, an entire house, etc.).

The lighting load 102 may be an example of a lighting load that is wired into a power control and/or delivery path of the lighting control system 100. As such, the lighting load 102 may be controllable by a wall-mounted control device such as a dimmer switch. The lighting load 104 may be an example of a lighting load that is equipped with integral load control circuitry and/or wireless communication capabilities such that the lighting load may be controlled via a wireless control mechanism (e.g., by a remote control device).

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads (e.g., so as to control an intensity level of the lighting loads 102, 104 between a low-end intensity level $L_{LE}$ and a high-end intensity level $L_{HE}$). The control devices may be configured to control an amount of power delivered to the lighting loads to an absolute level (e.g., to a maximum allowable amount), or by a relative amount (e.g., an increase of 10% from a current level). The control devices may be configured to control a color of the lighting load 102, 104 (e.g., by controlling a color temperature of the lighting loads or by applying full color control over the lighting loads).

The lighting loads 102, 104 may be smart lamps capable of sending and/or receiving wireless communications. The dimmer switch 110 may include a control circuit. The control circuit may be configured to be responsive to a user input and generate control instructions (e.g., a wired and/or wireless control signal) for controlling the lighting loads 102, 104 based on the user input. The control instructions may include commands and/or other information (e.g., such as identification information) for controlling the lighting loads 102, 104. The dimmer switch 110 may be configured to transmit messages via the RF signals 108 for controlling the lighting loads 102, 104. The dimmer switch 110 may include a wireless communication circuit that is configured to send/receive wireless signals such as the RF signals 108. For example, the dimmer switch 110 may be configured to transmit messages to lighting devices (e.g., the lighting loads 102, 104) that are within a wireless communication range of the dimmer switch 110 via the RF signals 108.

The control devices may be configured to activate a preset associated with the lighting load 102, 104. A preset may be associated with one or more predetermined settings of the lighting loads, such as an intensity level of the lighting loads and/or a color of the lighting loads. The presets may be configured via the control device and/or via an external device (e.g., a mobile device) by way of the wireless communication circuit of the control device. The control devices may be configured to activate control of a zone. A zone may correspond to one or more electrical loads that are configured to be controlled by the control devices. A zone may be associated with a specific location (e.g., a living room) or multiple locations (e.g., an entire house with multiple rooms and hallways). The control devices may be configured to switch between different operational modes. An operational mode may be associated with controlling different types of electrical loads or different operational aspects of one or more electrical loads. Examples of operational modes may include a lighting control mode for controlling one or more lighting loads (e.g., which in turn may include a color control mode and an intensity control mode), an entertainment system control mode (e.g., for controlling music selection and/or the volume of an audio system), an HVAC system control mode, a winter treatment device control mode (e.g., for controlling one or more shades), and/or the like.

One or more characteristics of the control device and/or the lighting load 102, 104 described herein may be customized via an advanced programming mode (APM). Such characteristics may include, for example, an intensity level associated with a preset, a fade-on/fade-off time, enablement/disablement of visual indicators, a low-end trim (e.g., a minimum intensity level to which the lighting load 102, 104 may be set by the control device), a high-end trim (e.g., a maximum intensity level to which the lighting load 102, 104 may be set by the control device), and/or the like. Examples of an advanced programming mode for a wall-mounted load control device can be found in U.S. Pat. No. 7,190,125, issued Mar. 13, 2007, entitled PROGRAMMABLE WALLBOX DIMMER, the entire disclosure of which is hereby incorporated by reference. The control device may be manipulated to enter the advanced programming mode in various ways. For instance, the control device may be moved into the advanced programming mode via a press-and-hold or a double-tap applied to a front area of the control device. Ways to activate the advanced programming mode for a control device will be described in greater detail below.

The control device described herein may be, for example, a dimmer switch 110, a retrofit remote control device 112, a wall-mounted remote control device 114, a tabletop remote control device 116, and/or a handheld remote control device 118, as shown in FIG. 1. The dimmer switch 110 may be configured to be mounted to a standard electrical wallbox (e.g., via a yoke) and be coupled in series electrical connection between an alternating-current (AC) power source 105 and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102, and generate respective control signals for executing the commands. Examples of wall-mounted dimmer switches are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remote control 112 may then be used to perform advanced functions that the toggle switch 122 may be incapable of performing (e.g., such as dimming the intensity level of the light output, changing the color of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or nightstand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled "Wireless Battery Powered Remote Control Having Multiple Mounting Means," and U.S. Pat. No. 7,573,208, issued Aug. 11, 2009, entitled "Method Of Programming A Lighting Preset From A Radio-Frequency Remote Control," the entire disclosures of which are hereby incorporated by reference.

It should be appreciated that, although a lighting control system with two lighting loads is provided as an example above, a load control system as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity level of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a set-point temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
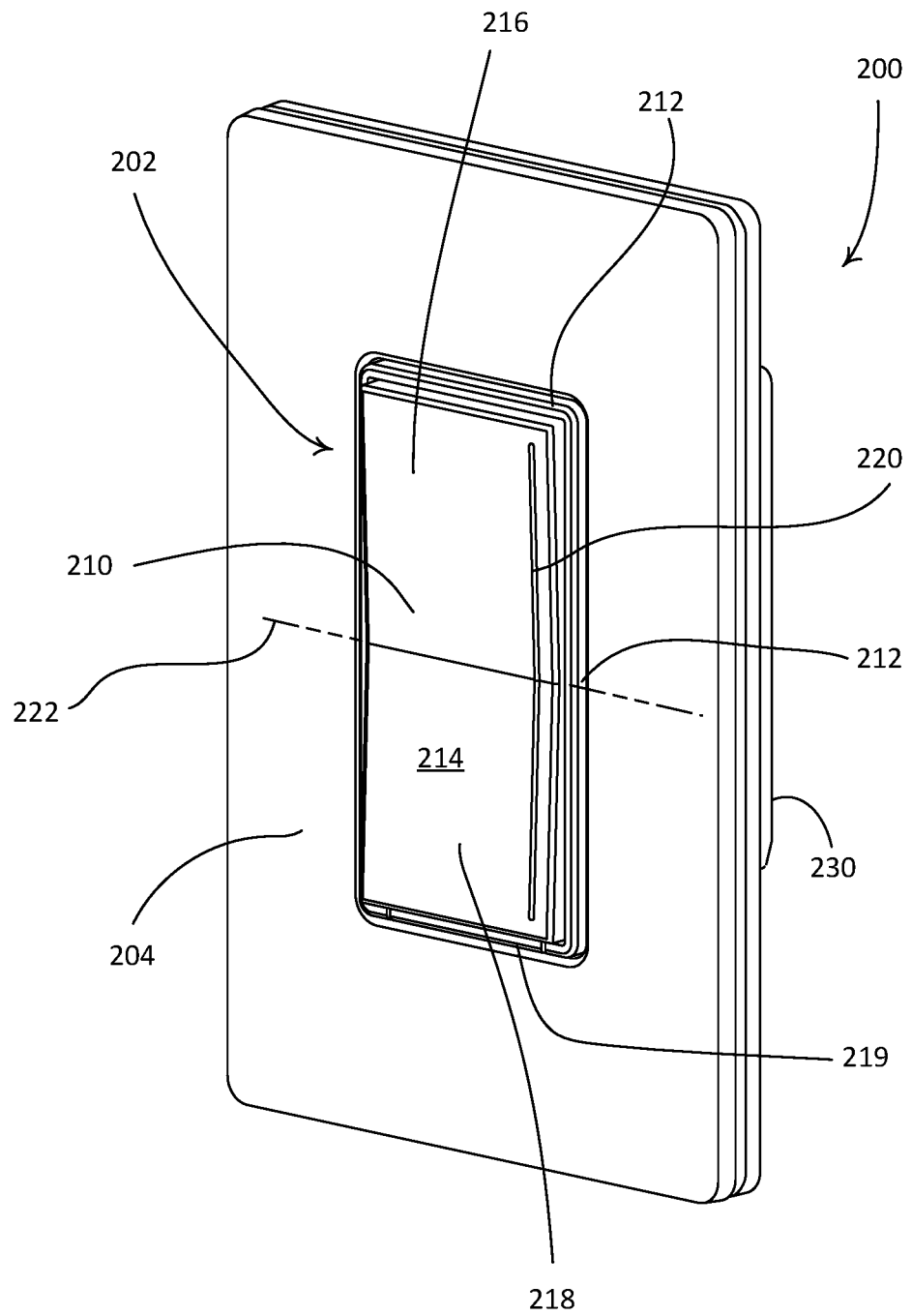
FIG. 2 is a perspective view of an example control device that may be deployed as a dimmer switch and/or a remote control device of the load control system illustrated in FIG. 1.
Figure 3:
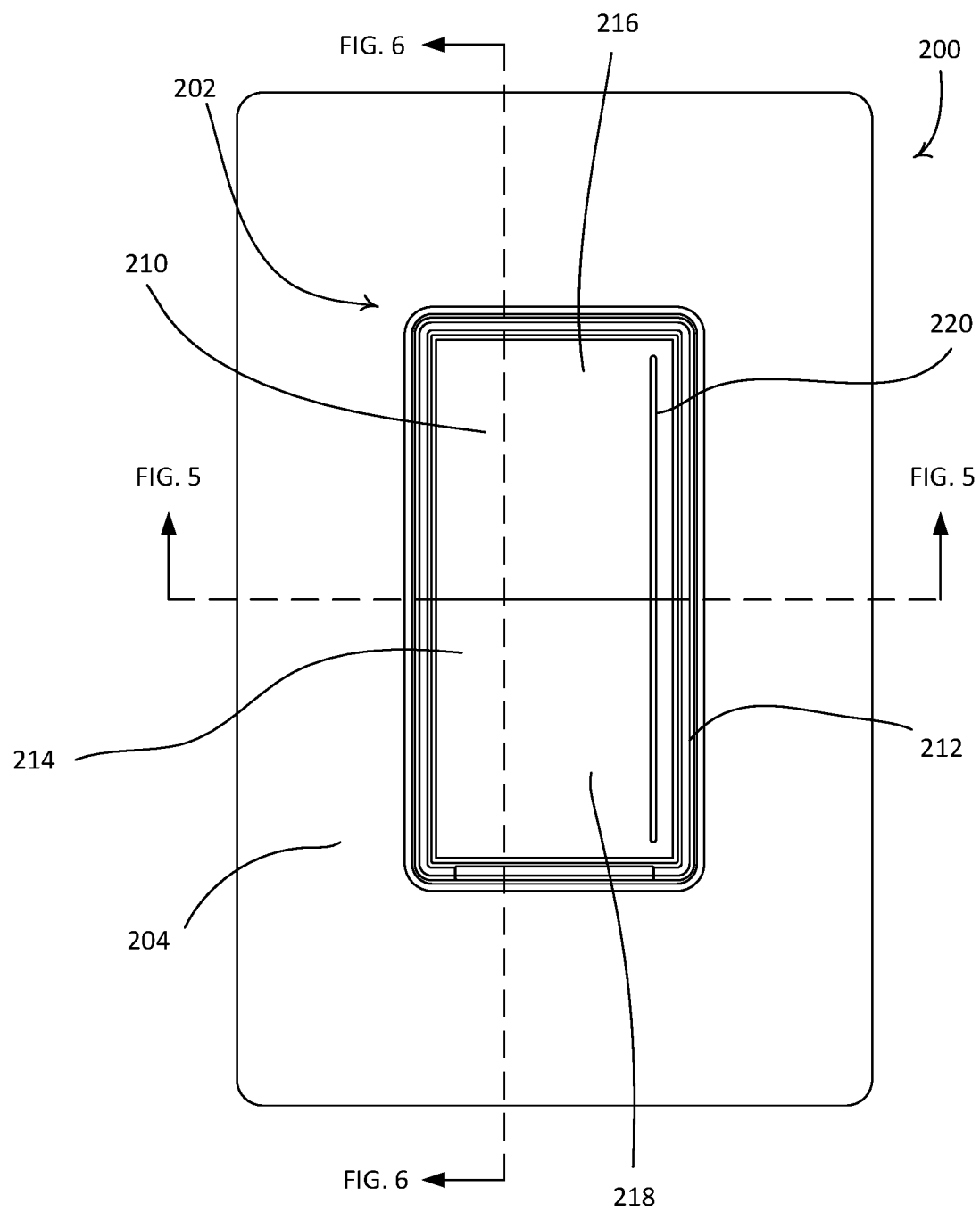
FIG. 3 is a front view of the control device of FIG. 2.

FIGS. 2-9 depict an example control device 200 that may be deployed as the dimmer switch 110 and/or the retrofit remote control device 112 in the lighting control system 100. FIG. 2 is a perspective view and FIG. 3 is a front view of the example control device 200. The control device 200 may comprise a user interface 202 and a faceplate 204. The control device 200 may be configured to control the amount of power delivered to a lighting load (e.g., turn the lighting load on or off, or adjust the intensity level of the lighting load by transmitting a message for controlling the lighting load via a communication circuit (e.g., a wireless signal via a wireless communication circuit), and/or by controlling the lighting load via an internal load control circuit (e.g., a controllably conductive device of the control device 200)). When the control device 200 is a wall-mounted dimmer switch, the control device 200 may comprise a rear enclosure 230 for housing load control circuitry of the control device 200. For example the rear enclosure 230 may enclose a portion (e.g., one or more components) of the control device 200. The control device 200 may be configured to be mounted to an electrical wallbox (e.g., a metal wallbox).

The user interface 202 of the control device 200 may include an actuation member 210 that is configured to be mounted to a bezel 212 (e.g., a base portion). The actuation member 210 may comprise a front surface 214 including an upper portion 216 and a lower portion 218. The user interface 202 may include a light bar 220 extending along the length of the front surface 214 of the actuation member 210. The light bar 220 may be configured to be illuminated by one or more light sources (e.g., one or more LEDs) to visibly display information. The actuation member 210 may be configured to pivot about a pivot axis 222 (e.g., a central axis) in response to a tactile actuation (e.g., a tactile input) of the upper portion 216 and the lower portion 218. The control device 200 may be configured to control a lighting load of the lighting control system 100 to turn the lighting load on in response to a tactile actuation of the upper portion 216, and to turn the lighting load off in response to a tactile actuation (e.g., a tactile input) of the lower portion 218 (or vice versa). For example, the control device 200 may be configured to turn the lighting load on to a previous intensity level (e.g., before the lighting load was previously turned off) or to a preset intensity level (e.g., a predetermined or locked preset intensity level) in response to a tactile actuation of the upper portion 216 of the actuation member 210. The control device 200 may include one or more tactile switches that are actuated in response to the tactile actuations of the upper and/or lower portions 216, 218 of the actuation member 210.

The control device 200 may be configured to control a lighting load of the lighting control system 100 in response to a touch actuation of the actuation member 210. For example, the actuation member 210 may also receive user inputs that do not cause the actuation member to pivot (e.g., about the pivot axis 222). At least a portion of the front surface 214 of the actuation member 210 may be configured as a touch sensitive surface (e.g., a capacitive touch surface) that is configured to receive (e.g., detect) inputs (e.g., touch actuations/inputs), such as point actuations or gestures, from a user of the control device 200. The touch sensitive surface of the actuation member 210 may be located adjacent to and/or overlap with the light bar 220. The actuation member 210 may substantially maintain its position (e.g., with respect to the bezel 212) in response to these inputs and, depending on the positions of the inputs, the control device may enter different operating modes and/or carry out different control functions in response. For example, during a normal operating mode of the control device 200, the front surface 214 of the actuation member 210 may be actuated along the light bar 220 (e.g., along the touch sensitive surface) to adjust the amount of power delivered to, and thus the intensity level of, the lighting load according to the position of the actuation. For instance, the control device 200 may control the magnitude of a load current conducted through the lighting load based on the position of a touch actuation (e.g., a touch input) along the touch sensitive surface of the actuation member 210 to control an intensity level of the lighting load between a low-end intensity level $L_{LE}$ and a high-end intensity level $L_{HE}$. The control device 200 may control an amount of power delivered to the lighting load to an absolute level (e.g., to a maximum allowable amount) or by a relative amount (e.g., an increase of 10% from a current level) based on the position of a touch actuation along the touch sensitive surface of the actuation member 210. Examples of control devices having capacitive touch surfaces are described in greater detail in commonly-assigned U.S. Pat. No. 10,109,181, issued Oct. 23, 2018, entitled GESTURE-BASED CONTROL DEVICE FOR CONTROLLING AN ELECTRICAL LOAD, and U.S. Patent Publication No. 2020/0382120, published Dec. 3, 2020, entitled LOAD CONTROL DEVICE HAVING A CAPACITIVE TOUCH SURFACE, the entire disclosure of which are hereby incorporated by reference. Although described primarily in context of a capacitive touch surface, it should be appreciated that the control device 200 is not so limited, and in some examples, at least a portion of the front surface 214 of the actuation member 210 may be configured as a different type of touch sensitive surface, such as a resistive touch surface, an inductive touch surface, a surface acoustic wave (SAW) touch surface, an infrared touch surface, acoustic pulse touch surface, or the like.

The control device 200 may control the magnitude of a load current conducted through the lighting load based on a single discrete input along the touch sensitive surface and/or based on a plurality of consecutive inputs along the touch sensitive surface. For example, the user may tap their finger at a position along the touch sensitive surface, and in response, the control device 200 may turn the lighting load on to an intensity level based on the position. As an example, if the lighting load is off, the control device 200 may turn the lighting load on to an intensity level based on the position of a touch actuation along the touch sensitive surface of the actuation member 210. While the lighting load is on, the user may move (e.g., slide) their finger along the touch sensitive surface, and in response, the control device 200 may adjust (e.g., continuously control) the magnitude of the load current conducted through the lighting load based on the positions of a plurality of inputs along the touch sensitive surface.

Further, in a color control mode, the control device 200 may control a color of the lighting load based on the position of a touch actuation along the touch sensitive surface of the actuation member 210 (e.g., by controlling a color temperature of the lighting load or by applying full color control over the lighting load). For example, the light bar 220 may be configured to illuminate a spectrum of colors through the length of the light bar 220 (e.g., across the full visible color spectrum, a subset of the visual color spectrum, and/or the light spectrum associated with the color temperatures of a black body radiator). Accordingly, the control device 200 may control the color of the lighting load based on the position of a touch actuation along the touch sensitive surface, and in turn, the corresponding color of that position on the light bar 220.

The control device 200 may be configured to prioritize user inputs that cause the actuation member 210 to pivot over user inputs that do not cause the actuation member 210 to pivot, or vice versa. For example, when the lighting load is off and a user moves a finger close to the upper portion 216 of the actuation member 210 causing the control device 200 to detect a touch actuation via the touch sensitive surface (e.g., along the light bar 220), the control device 200 may temporarily delay responding to the touch actuations received via the touch sensitive surface to see if a user is attempting to actuation the upper portion 216 of the actuation member 210 to turn on the lighting load. Accordingly, the control device 200 may avoid turning on the lighting load to an intensity level based on the position of the actuation on the light bar 220 (e.g., in response to the touch sensitive surface) if the user's finger happens to sweep past the light bar 220 while actuating the upper portion 216 of the actuation member 210 or if the user's finger actuates the upper portion 216 of the actuation member 210 too close to the light bar 220. In addition, when the lighting load is on and a user moves a finger close to the lower portion 218 of the actuation member 210 causing the control device 200 to detect a touch actuation via the touch sensitive surface, the control device 200 may temporarily ignore the touch actuations received via the touch sensitive surface after the actuation of the lower portion 218. Accordingly, the control device 200 may avoid turning on the lighting load again if the user's finger happens to sweep past the light bar 220 while moving away from the lower portion 218 of the actuation member 210.

The control device 200 may, for example, be configured to prioritize inputs received in response to actuation of the actuation member 210 over the inputs received via the touch sensitive surface by ignoring inputs received via the touch sensitive surface when a tactile actuation of the actuation member 210 is received within a blanking period (e.g., a first blanking period or an after-touch blanking period) after an initial detection of a touch actuation received via the touch sensitive surface. For example, the blanking period may be approximately 200 milliseconds. The blanking period may occur after (e.g., in response to) a touch actuation (e.g., the initial detection of a touch actuation). That is, the control device 200 may ignore touch actuations received via the touch sensitive surface when a touch actuation of the actuation member 210 is received within the blanking period (e.g., a touch actuation that begins during the blanking period). For instance, in some examples, the control device 200 may start the blanking period (e.g., a timer) in response to receiving a touch actuation via the touch sensitive surface, and ignore touch actuations received via the touch sensitive surface during the blanking period if the control device 200 receives a touch actuation of the actuation member 210 during the blanking period (e.g., a touch actuation begins during the blanking period). As such, the control device 200 may prioritize user inputs that cause the actuation member 210 to pivot over user inputs that do not cause the actuation member 210 to pivot during the blanking period.

Further, even if a blanking period is implemented, the control device 200 may be configured to respond to a quick "tap" along the touch sensitive surface. For instance, the control device 200 may be configured to determine that a touch actuation is at a position on the touch sensitive surface for an amount of time that is shorter than the blanking period without the actuation member 210 being actuated (e.g., a touch actuation starts and finishes before the end of the blanking period) and, in response, turn the lighting load on to an intensity level associated with the position in response to the touch actuation. Accordingly, the control device 200 may both implement the blanking period to avoid unintentional touch actuations along the touch sensitive surface and still respond quickly to intentional touch actuations along the touch sensitive surface.

The control device 200 may be configured to turn the lighting load on in response to a touch actuation received via the touch sensitive surface even when implementing the blanking period. For example, the control device 200 may be configured to receive a touch actuation via the touch sensitive surface at a position for an amount of time that is greater than the blanking period without the tactile switch being actuated (e.g., a touch actuation begins during the blanking period and ends after the blanking period) and, in response, turn the lighting load on to an intensity level associated with the position in response to the touch actuation. Further, the control device 200 may adjust the length of a blanking period, for example, through a user input (e.g., a touch actuation and/or a tactile actuation) received while in the advanced programming mode. For instance, in some examples, the blanking period may be configured to be greater than one second (e.g., multiple seconds). In such examples, the control device 200 may respond to a press-and-hold touch actuation along the light bar 220 by turning the lighting load on to an intensity level associated with the position of the press-and-hold actuation.

The control device 200 may be configured to temporarily ignore inputs received via the touch sensitive surface after a tactile actuation of the actuation member 210 that causes the lighting load to turn on or off. The control device 200 may be configured in this manner to, for example, avoid mistakenly turning the lighting load back on and/or adjusting the power delivered to (e.g., the intensity level of) the lighting load after a tactile actuation of the actuation member 210. For example, the control device 200 may be configured to ignore inputs received via the touch sensitive surface during a blanking period (e.g., a second blanking period or after-tactile period) after detecting a tactile actuation of the actuation member to turn the lighting load on or off. For instance, in some examples, the control device 200 may start the blanking period in response to turning on or off the lighting load and, during the blanking period, ignore inputs received via the touch sensitive surface during the blanking period. As such, through the use of the blanking period, the control device 200 may be able avoid unintentional touch actuations along the touch sensitive surface after a tactile actuation of the actuation member 210. In sum, the control device 200 may be configured with one or more blanking periods, such as a first blanking period that is used to avoid unintentional touch actuations after an initial detection of a touch actuation received via the touch sensitive surface and prior to tactile actuations of the actuation member 210 (e.g., a blanking period that occurs after (e.g., in response to) a touch actuation), and/or a second blanking period that is used to avoid unintentional touch actuations after tactile actuations of the actuation member 210 (e.g., a blanking period that occurs after (e.g., in response to) a tactile actuation).

Figure 4:
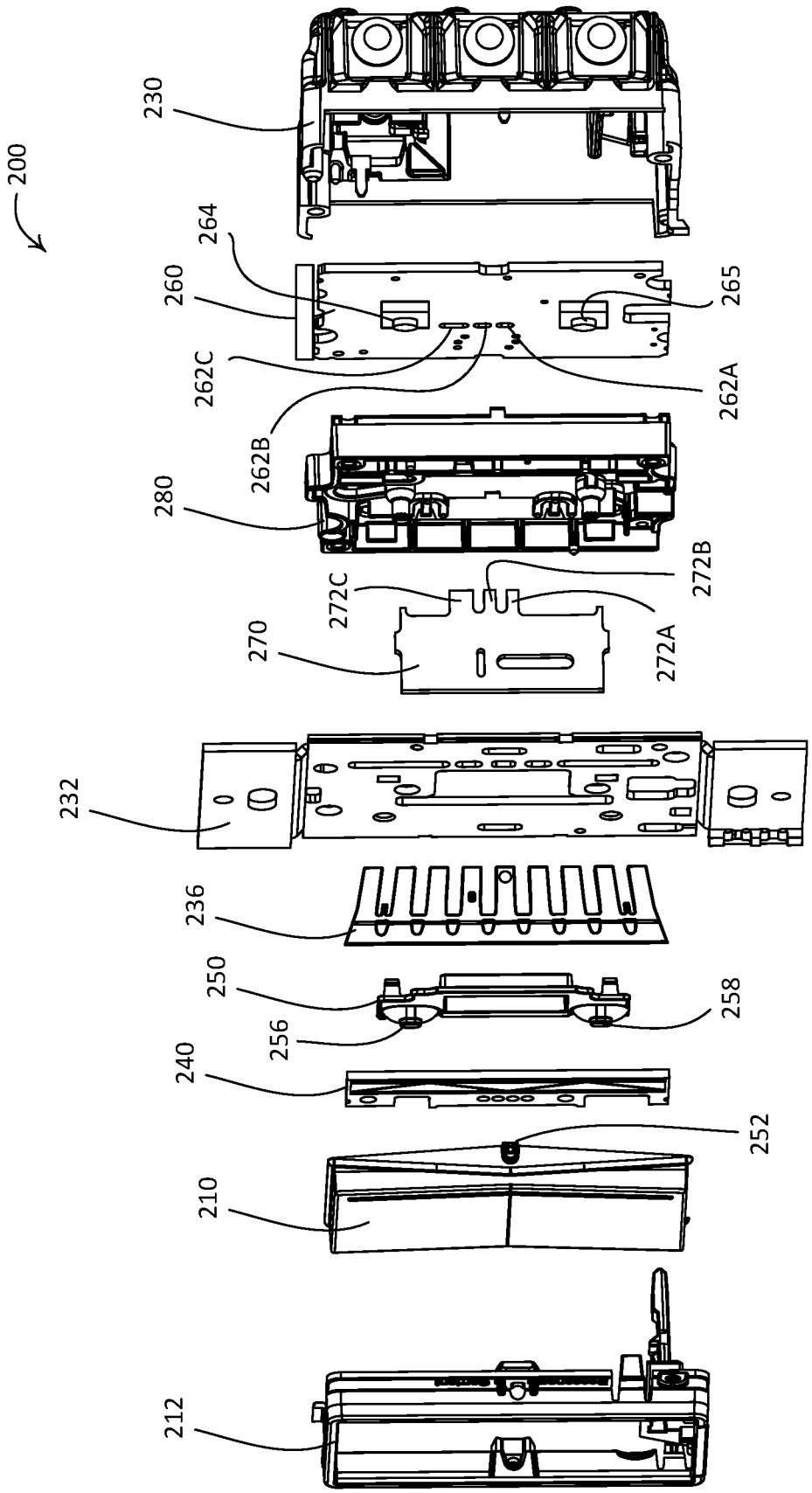
FIG. 4 is a partially exploded view of the control device of FIG. 2.
Figure 5:
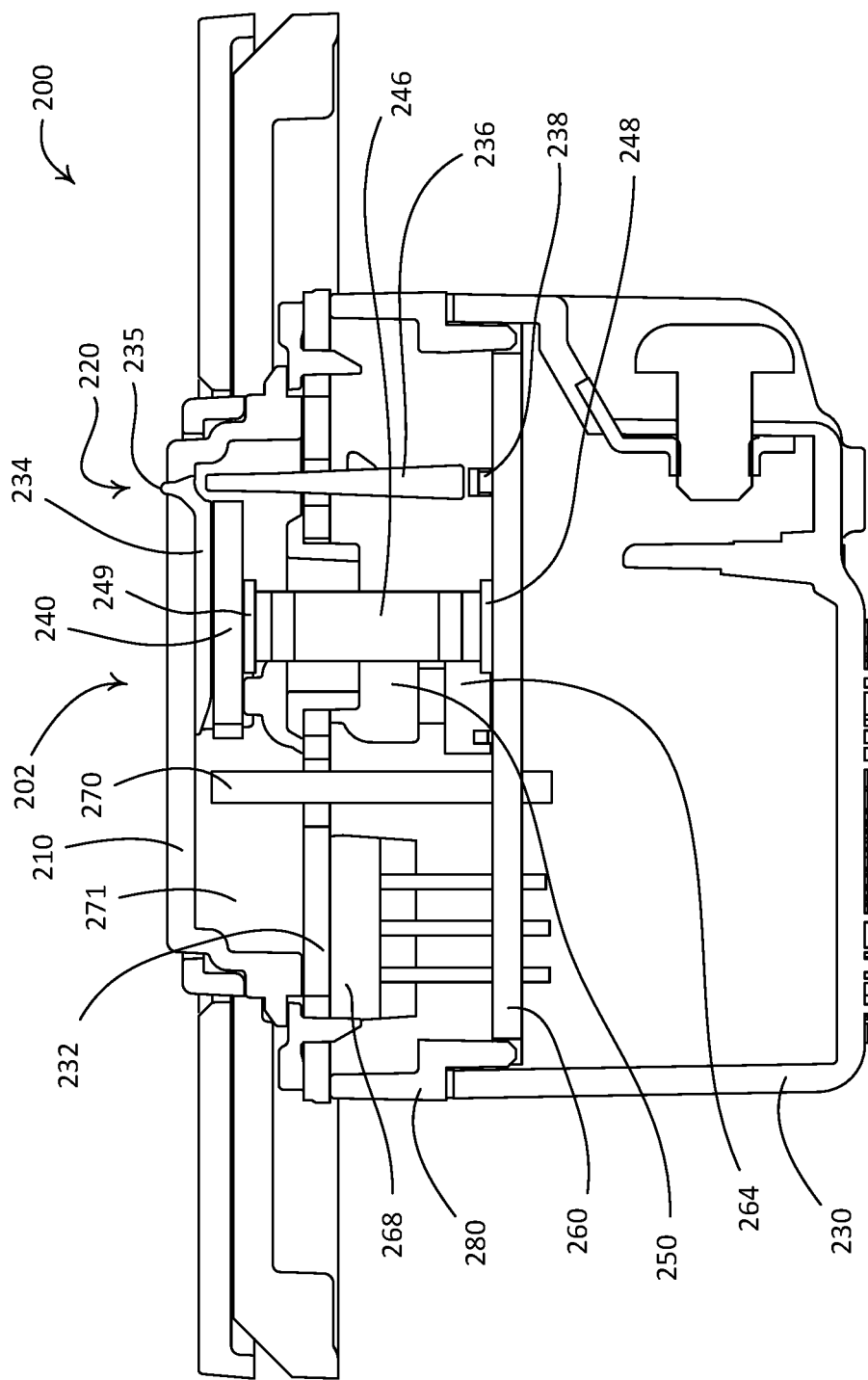
FIG. 5 is a cross-sectional view of the control device of FIG. 2 taken through the center of the control device (e.g., through the line shown in FIG. 3).
Figure 6:
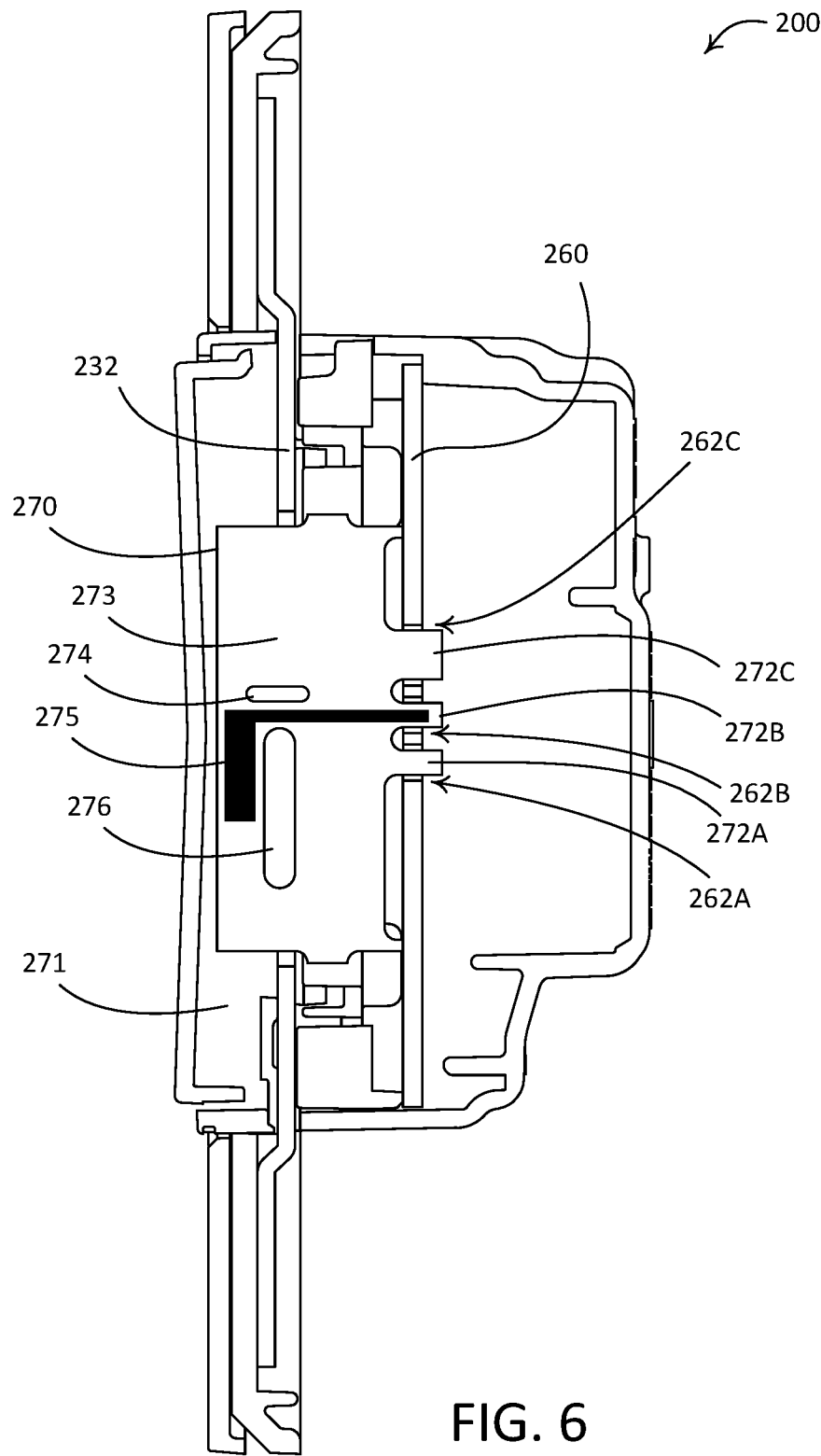
FIG. 6 is a side cross-sectional view of the control device of FIG. 2 taken through a center of an antenna printed circuit board (e.g., through the line shown in FIG. 3).
Figure 7:
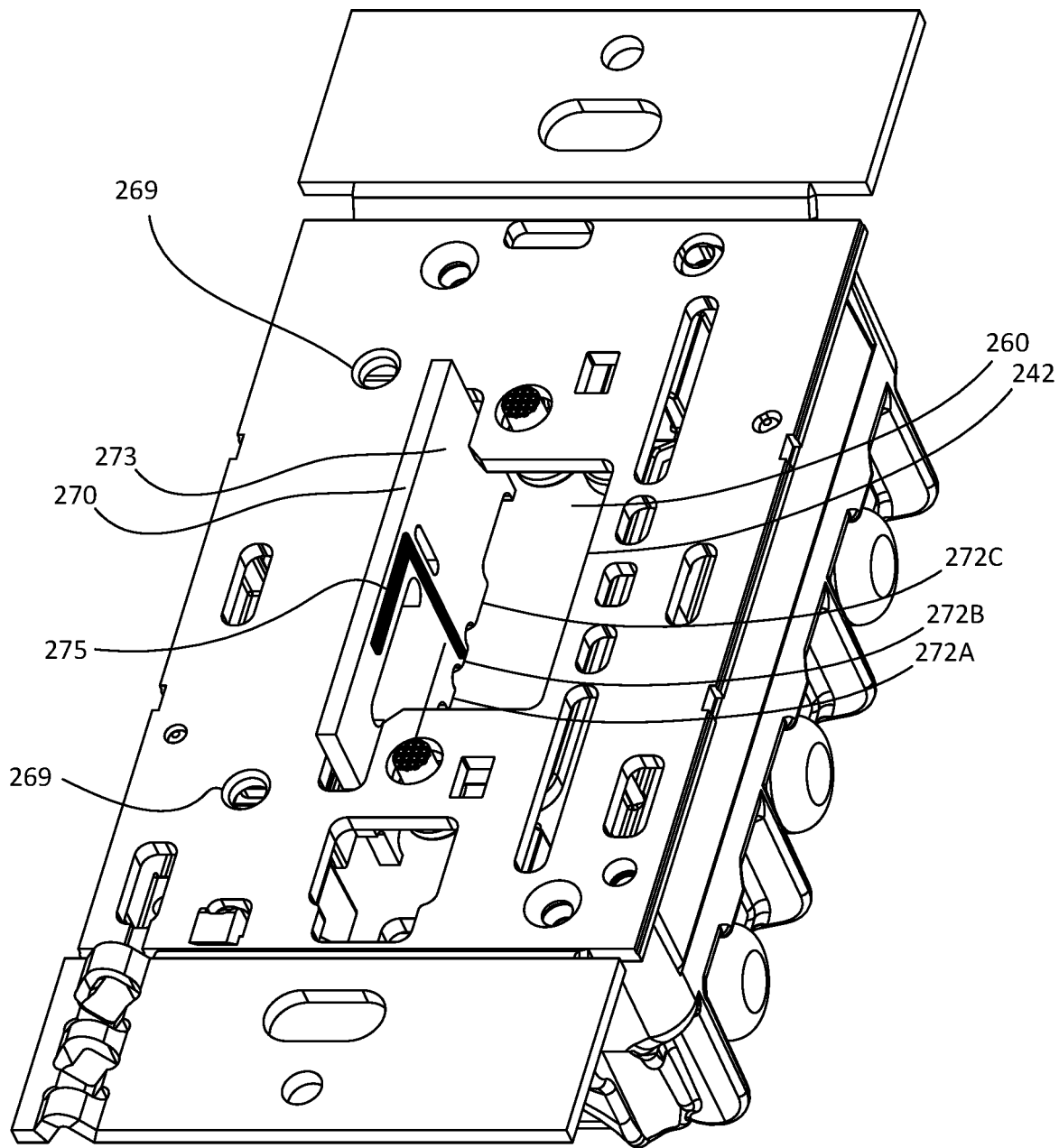
FIG. 7 is a perspective view of a base portion of the control device of FIG. 2.
Figure 8:
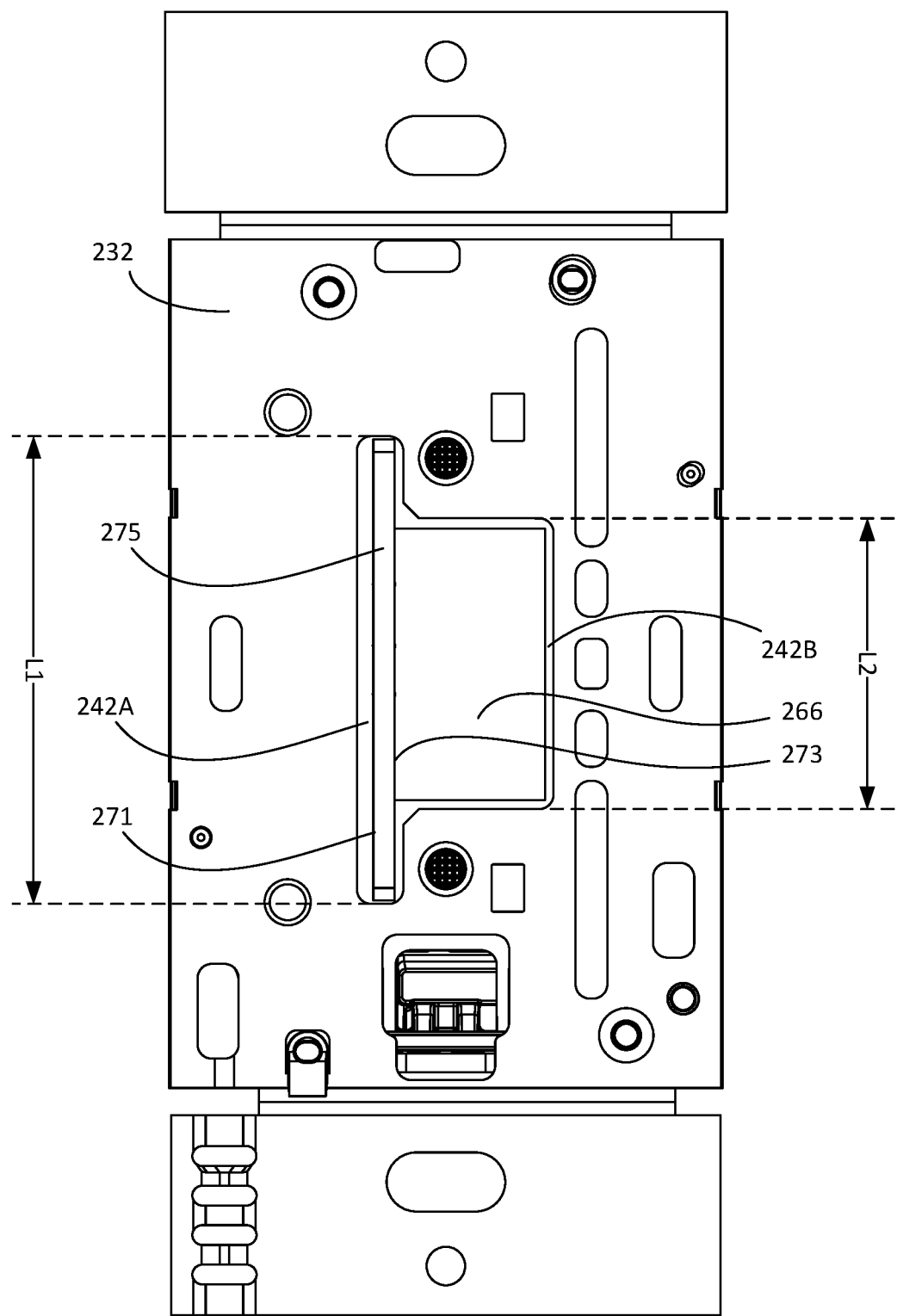
FIG. 8 is a front view of the base portion of the control device of FIG. 2.
Figure 9:
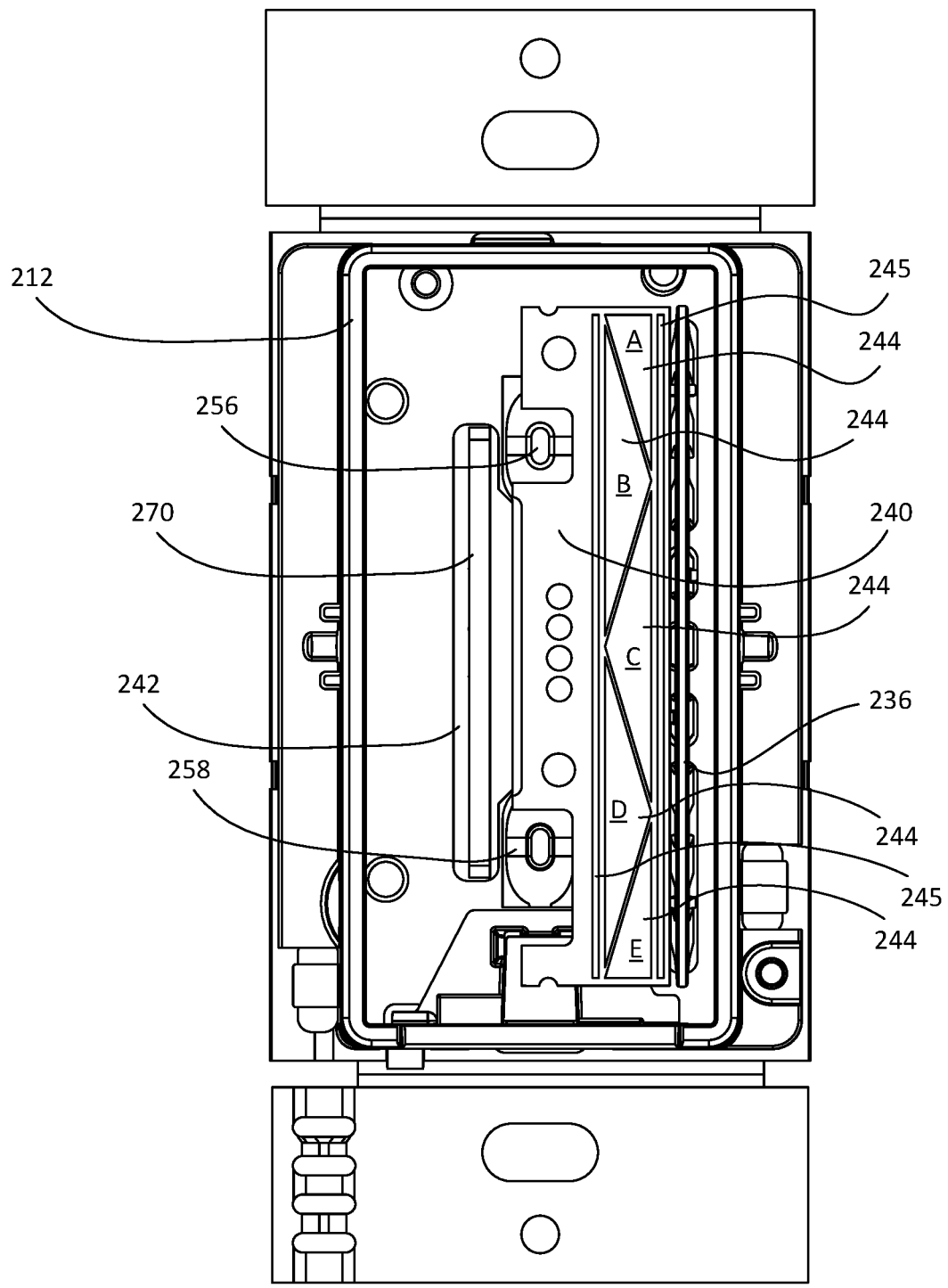
FIG. 9 is a front view of the control device of FIG. 2 with an actuator removed.

FIG. 4 is an exploded view of the control device 200. The control device 200 may include the actuation member 210, the bezel 212, an enclosure ring 280, a capacitive touch PCB 240, and a rear enclosure 230. FIG. 5 is a top cross-sectional view of the control device 200 taken through the line shown in FIG. 3. FIG. 6 is a right side cross-sectional view of the control device 200 taken through the line shown in FIG. 3. FIG. 7 is a perspective view of the control device 200 with the bezel 212, the actuation member 210, and the capacitive touch PCB 240 removed. FIG. 8 is a front view of the control device 200 with the bezel 212, the actuation member 210, and the capacitive touch PCB 240 removed. FIG. 9 is a front view of the control device 200 with the actuation member 210 removed. As noted herein, the enclosure ring 280 and the rear enclosure 230 may together house the load control circuitry of the control device 200. Although illustrated with the enclosure portion 280 and/or the rear enclosure 230, in some examples, such as when the control device 200 is a wireless, remote control device, the enclosure ring 280 and/or the rear enclosure 230 may be omitted. In such examples, the control device 200 may connect to a base that is affixed to the toggle or paddle actuator of a standard light switch.

The control device 200 may comprise a yoke 232 that may be configured to mount the control device 200 to an electrical wallbox (e.g., when the control device 200 is a wall-mounted dimmer switch). The yoke 232 may be connected to the rear enclosure 230, such that a main printed circuit board (PCB) 260 of the control device 200 is located between the enclosure ring 280 and the rear enclosure 230. The yoke 232 may be a metal yoke and may be configured as a heat sink for the control device 200. For example, the yoke 232 may include metal. As shown in FIG. 5, the control device 200 may comprise a diffuser 234 including a protruding portion 235 that extends through an elongated opening in the actuation member 210 to form the light bar 220. The control device 200 may also comprise a light pipe 236 that may be configured to conduct light from one or more light sources 238 located inside of the rear enclosure 230 to the light bar 220. For example, the light sources 238 may comprise one or more light-emitting diodes (LEDs) mounted to the main PCB 260.

Figure 11:
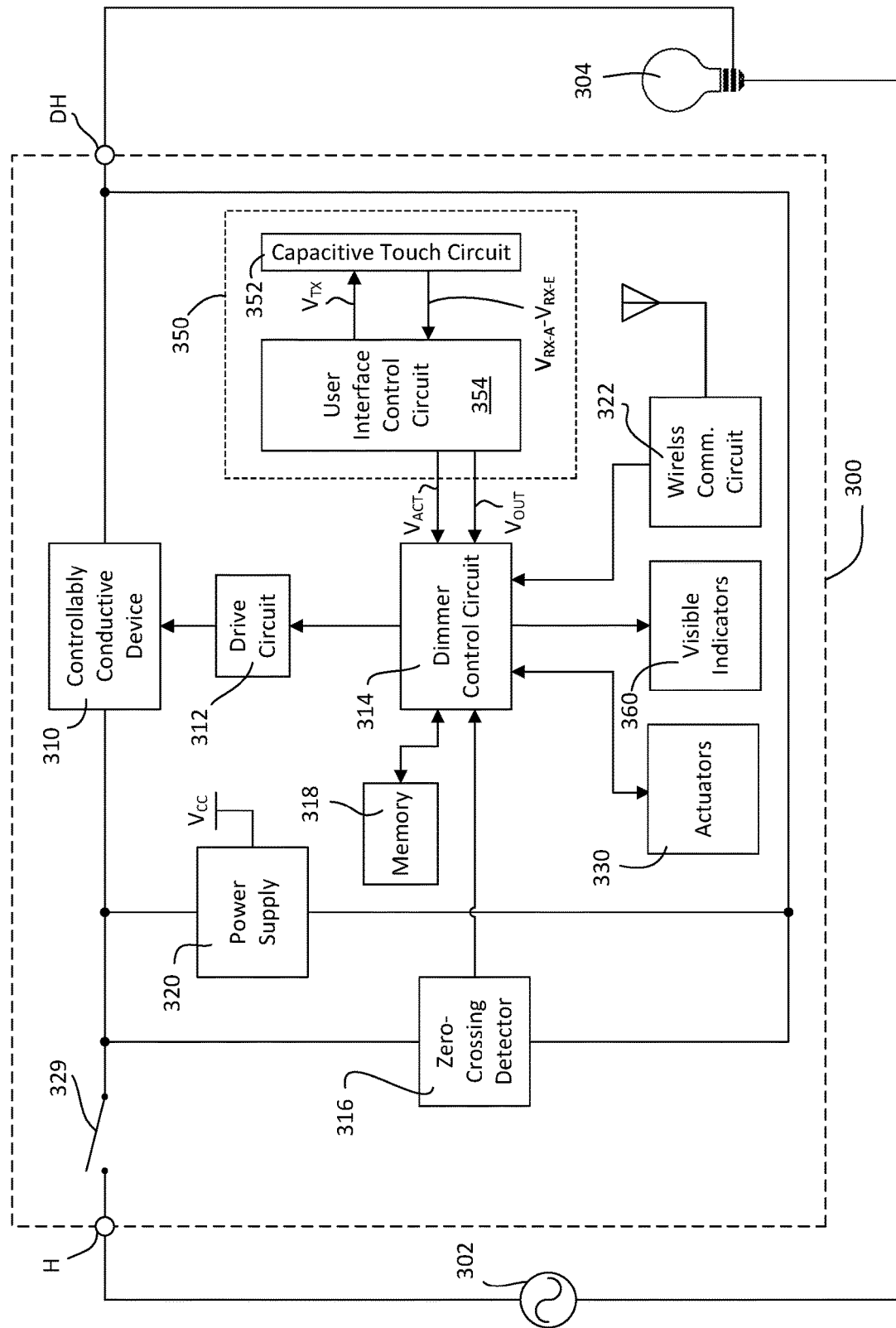
FIG. 11 shows a simplified block diagram of an example control device (e.g., dimmer switch) that may be implemented as the control device illustrated in FIG. 2.

The main PCB 260 may be located within the rear enclosure 230. For example, the main PCB 260 may be attached to the rear enclosure 230 or the enclosure ring 280. The main PCB 260 may have mounted thereto the load control circuitry used to control power delivered to an electrical load. For example, the main PCB 260 may have mounted thereto any combination of a control circuit (e.g., a primary control circuit), memory, a drive circuit, one or more controllably conductive devices, a zero-crossing detector, a power supply, etc. (e.g., as shown in FIG. 11). For example, the controllably conductive devices of the control device 200 may include a bidirectional semiconductor switch 268. The bidirectional semiconductor switch 268 may comprise a triac, a field-effect transistor (FET) in a rectifier bridge, two FETs in anti-series connection, one or more silicon-controlled rectifiers (SCRs), or one or more insulated-gate bipolar junction transistors (IGBTs). The control circuit of the main PCB 260 may be configured to render the bidirectional semiconductor switch 268 conductive or non-conductive, for example, to control the amount of power delivered to the electrical load. As shown in FIG. 5, the bidirectional semiconductor switch 268 may be mechanically connected to the yoke 232, for example, via one or more rivets (not shown) received through one or more opening 269 in the yoke 232 (e.g., shown in FIG. 7). The bidirectional semiconductor switch 268 may be thermally coupled to the yoke 232, for example, to dissipate heat generated by the bidirectional semiconductor switch 268.

The control device 200 may also include mechanical switches, such as first and second tactile switches 264, 265, that may be mounted to the main PCB 260. The first and second tactile switches 264, 265 may be actuated in response to actuations (e.g., tactile actuations) of the upper portion 216 and the lower portion 218 of the actuation member 210, respectively (e.g., to control turning the load on and off). In some examples, the control device 200 may be configured to control a lighting load of the lighting control system 100 to turn the load on in response to an actuation of the first tactile switch 264 and to turn the load off in response to an actuation of the second tactile switch 265.

The control device 200 may also comprise a touch sensitive printed circuit board, such as a capacitive touch printed circuit board (PCB) 240. The capacitive touch PCB 240 may be located behind (e.g., along the rear surface of) the user interface 202 (e.g., the actuation member 210) for detecting actuations of the front surface 214 of the actuation member 210. The capacitive touch PCB 240 may be planar. The capacitive touch PCB 240 may include one or more pads located adjacent to (e.g., but not immediately behind) the light bar 220 for detecting touch actuations of the light bar 220 (e.g., and/or touch actuations of the front surface 214 of the actuation member 210 adjacent to the light bar 220). In some examples, the capacitive touch PCB 240 is not located immediately behind the light bar 220 since the light pipe 236 may extend from the light sources 238 in the enclosure 230 to the light bar 220. Further, the capacitive touch PCB 240 may be mounted or affixed to the actuation member 210, for example, such that movement or the actuation member 210 causes movement of the capacitive touch PCB 240. That is, the capacitive touch PCB 240 creates the touch sensitive surface on the front side of actuation member 210, and as such, the touch surface also moves with tactile actuations of the actuation member 210.

The capacitive touch PCB 240 may include a capacitive touch controller and one or more receiving capacitive touch pads 244 for detecting the touch actuations on or adjacent to the light bar 220. The receiving capacitive touch pads 244 may be arranged in a linear array that extends from the top to the bottom of the capacitive touch PCB 240 (e.g., below the area 249). The capacitive touch PCB 240 (e.g., the capacitive touch controller) may be configured to detect the position of the touch actuation along the length of the light bar 220 in response to touch actuations received from the one or more receiving capacitive touch pads 244 and to control the electrical loads according to the determined position. For example, the capacitive touch PCB 240 (e.g., the capacitive touch controller) may provide an output signal to the main PCB 260, and the main PCB 260 may control the electrical load(s) based on the determined position (e.g., by controlling a drive circuit of the control device 200, by sending a message, such as a digital message, to the electrical load and/or to a system controller, etc.). The capacitive touch PCB 240 may be electrically connected to the main PCB 260 via a cable 246 (e.g., a ribbon cable) connected to a first connector 248 on the main PCB 260 and a second connector 249 on the capacitive touch PCB 240 (e.g., as shown in FIG. 5).

The capacitive touch pads 244 may include one or more electrodes. For example, as shown in FIGS. 4 and 5, the diffuser 234 may be located between actuation member 210 and the capacitive touch pads 244 on the capacitive touch PCB 240, such there may not be any air between the actuation member 210 and the capacitive touch pads 244 to improve the sensitivity of the capacitive touch controller. The capacitive touch PCB 240 may receive power from a power supply of the main PCB 260 to power the components of the capacitive touch PCB 240.

The actuation member 210 may include pivot arms 252 that enable the actuation member 210 to pivot about the pivot axis 222 in response to respective tactile actuation of the upper portion 216 and the lower portion 218. As described herein, the capacitive touch PCB 240 may be mounted to the actuation member 210. Accordingly, the capacitive touch PCB 240 may move (e.g. pivot) when the actuation member 210 pivots in response to a tactile actuation of the upper or lower portion 216, 218. The pivot arms 250 may define the pivot axis 222 of the actuation member 210. The PCB 240 may create the touch sensitive surface on the front surface 214 of the actuation member 210, and as such, the touch sensitive surface may also move with tactile actuations of the actuation member 210. In examples, the capacitive touch PCB 240 may be a solid PCB (e.g., PCB with a solid substrate). In examples, the capacitive touch PCB 240 may be a flexible PCB (e.g., PCB with a flexible substrate) to enable further movement or bend of the capacitive touch PCB 240 in response to tactile actuations of the actuation member 210.

The tactile actuation of the actuation member 210 may cause one of the first and second tactile switches 264, 265 of the main PCB 260 to be actuated. For example, when the upper portion 216 of the actuation member 210 is actuated, the diffuser 234 may be moved toward the main PCB 260. The diffuser 234 may contact a rubber membrane 250 (e.g., rubber membrane extension 256) which may deflect inward (e.g., toward the main PCB 260) to actuate the first tactile switch 264 of the main PCB 260. Similarly, when the lower portion 218 of the actuation member 210 is actuated, the diffuser 234 may be moved toward the main PCB 260. The diffuser 234 may contact the rubber membrane 250 (e.g., rubber membrane extension 258), which may deflect inward (e.g., toward the main PCB 260) to actuate the second tactile switch 265 of the main PCB 260. Accordingly, the capacitive touch PCB 240 may be affixed to the actuation member 210, and the actuation member 210, when actuated, may pivot to actuate a tactile switch on a separate main PCB 260 of the control device 200. As such, tactile actuations of the actuation member 210 may cause movement of the capacitive touch PCB 240 (e.g., and the diffuser 234).

Further, it should also be appreciated that the diffuser 234 may be configured to perform multiple functions. For example, the diffuser 234 may be configured to diffuse light emitted from light sources 238 located inside the enclosure 230 to the light bar 220 located on the front surface 214 of the actuation member 210, and may also be configured to cause the actuation of one or more of the tactile switches 264, 265 located on the main PCB 260. Stated differently, the diffuser 234 may be configured to transfer movement of the actuation member 210 to the tactile switches 264, 265, for example, via the capacitive touch PCB 240 and/or the rubber membrane 250.

In alternate examples, the capacitive touch PCB 240 may include tactile switches on the back of the capacitive touch PCB 240. In such embodiments, the tactile switches of the capacitive touch PCB 240 would be actuated in response to tactile actuations of the upper portion 216 and the lower portion 218 of the actuation member 210. That is, tactile actuations of the actuation member 210 would cause the upper portion 216 or the lower portion 218 to move into the tactile switches of the capacitive touch PCB 240, for example, to actuate the tactile switches.

The capacitive touch PCB 240 may comprise a plurality of (e.g., five) receiving capacitive touch pads 244 (e.g., capacitive touch regions A-E) as shown in FIG. 9. The receiving capacitive touch pads 244 may each be triangular in shape and may be arranged in a linear array that extends from the top to the bottom of the capacitive touch PCB 240 (e.g., on the right side of the capacitive touch PCB 240). For example, the capacitive touch region A and the capacitive touch region E of the receiving capacitive touch pads 244 may be electrically coupled together.

Although described as a capacitive touch PCB 240, in some examples, the control device 200 may include any PCB, such as the main PCB 260, at the position where the capacitive touch PCB 240 is illustrated in FIGS. 4 and 9. In such examples, the PCB may be located behind (along the rear surface of) the actuation member 210. This PCB may include any combination of circuitry, such as any combination of the circuitry described with reference to the capacitive touch PCB 240, the main PCB 260, a communication circuit (e.g., a wireless communication circuit), and/or a sensing circuit (e.g., a proximity sensing circuit, an ambient light sensing circuit, etc.). As such, the PCB may both move in response to actuations of the actuation member 210 and perform the functions enabled by the relevant circuitry (e.g., control internal or external light sources based on feedback from an ambient light sensor and/or a proximity sensor, wirelessly transmit control signals to external electrical loads, etc.).

Figure 10:
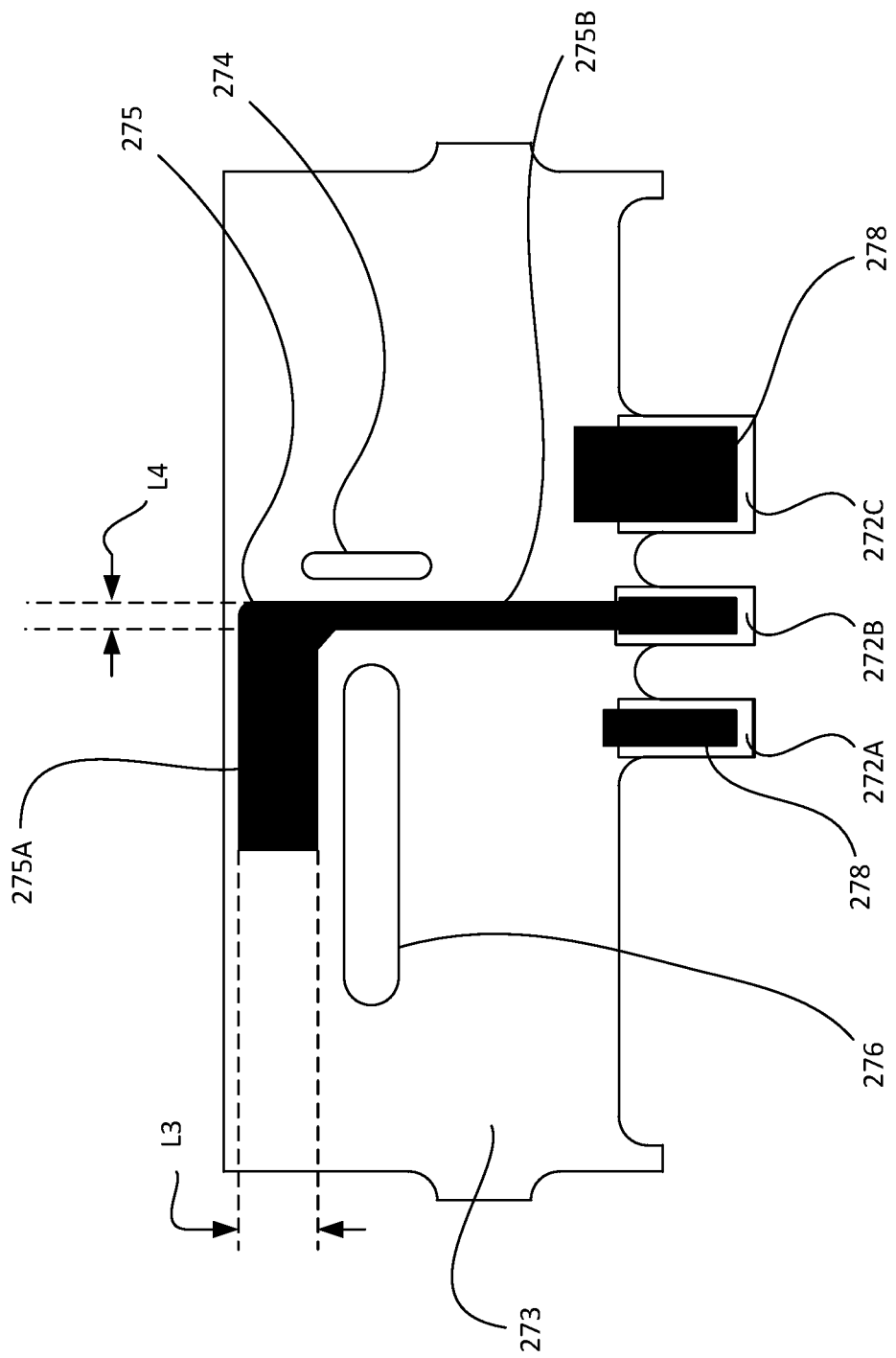
FIG. 10 is a side view of an example antenna printed circuit board.

The control device 200 may be configured to transmit and receive wireless messages, e.g., radio-frequency (RF) signals. The control device 200 may include an antenna 275 and a communication circuit (e.g., such as antenna 324 and wireless communication circuit 322 shown in FIG. 11). The wireless communication circuit may comprise an RF transceiver coupled to the antenna 275 for transmitting and/or receiving RF signals. In addition, the wireless communication circuit may comprise an RF transmitter for transmitting RF signals, an RF receiver for receiving RF signals. The control device 200 may include an antenna PCB 270. FIG. 10 is a side view of the antenna PCB 270. The antenna PCB 270 may define a first surface 271 and a second surface 273. The antenna PCB 270 may include the antenna 275. The antenna 275 may be a monopole antenna that is configured to operate at 2.4 GHz. The antenna 275 may be configured to transmit and/or receive the wireless signals (e.g., the RF signals). The antenna 275 may be located on the second surface 273 of the antenna PCB 270. The wireless communication circuit may be coupled to the antenna 275 for transmitting and/or receiving messages that include command(s) for controlling one or more electrical loads via the RF signals. The wireless communication circuit may determine the one or more commands for controlling the one or more electrical loads based on the inputs from the capacitive touch PCB 240. The control device 200 may control the bidirectional semiconductor switch 268 to control the amount of power delivered to the electrical load in response to a command received via the wireless communication circuit. The control device 200 may determine a command to transmit via the wireless communication circuit based on user input on the actuation member 210.

The antenna PCB 270 may be configured to be received by (e.g., connected to) the main PCB 260. When the antenna PCB 270 is connected to the main PCB 260, the first surface 271 may be facing the light pipe 236 and the second surface 273 may be facing away from the light pipe 236. The antenna PCB 270 may include a plurality of fingers 272A, 272B, 272C that are configured to connect the antenna PCB 270 to the main PCB 260. For example, one or more of the fingers 272A, 272B, 272C may include conductors (e.g., gold-plated conductors) that are configured to contact corresponding contacts on the main PCB 260. The main PCB 260 may define openings 262A, 262B, 262C that are configured to receive the fingers 272A, 272B, 272C. The fingers 272A, 272B, 272C may be soldered into the openings 262A, 262B, 262C to provide mechanical and electrical connection between the antenna PCB 270 and the main PCB 260. In addition, when the fingers 272A, 272B, 272C are received by the openings 262A, 262B, 262C, frictional forces may retain the connection between the antenna PCB 270 and the main PCB 260. The antenna 275 of the antenna PCB 270 may be electrically connected to the wireless communication circuit on the main PCB 260 via the middle finger 272B. The additional outside fingers 272A, 272C may provide additional mechanical support for the antenna PCB 270. The finger 272C may be wider than fingers 272A, 272B, for example, as shown in FIGS. 6 and 10. It should be appreciated that the fingers 272A, 272B, 272C are not limited to the geometry shown in FIGS. 6 and 10. Rather, the fingers 272A, 272B, 272C may define any respective width(s). Additionally or alternatively, the antenna PCB 270 may include more or less fingers than the three fingers 272A, 272B, 272C shown in FIGS. 6 and 10.

The antenna PCB 270 may be configured such that a portion of the antenna 275 protrudes through an opening 242 defined by the yoke 232. For example, the antenna 275 may extend from a location proximate to the main PCB 260 through the opening 242. The opening 242 may define a first portion 242A that is configured to receive a portion of the antenna PCB 270 and a second portion 242B that is configured to receive the cable 246 connected between the capacitive touch PCB 240 and the main PCB 260. For example, the second portion 242B may be configured to enable electrical connection of the capacitive PCB 240 to the main PCB 260. The first portion 242A may be longer than the second portion 242B, for example, to receive the antenna PCB 270. The first portion 242A may define a length L1 and the second portion 242B may define a length L2. The length L1 may be greater than the length L2. It should be appreciated that the opening 242 may define different geometry than shown in FIG. 8. For example, the length L1 and the length L2 may be equal such that the opening 242 is rectangular. In examples, the length L2 may be greater than the length L1 such that the first portion 242A is longer than the second portion 242B.

The portion of the antenna 275 that protrudes through the opening 242 may be located within a cavity 271 defined by the actuation member 210, the bezel 212, and the yoke 232. For example, the antenna 275 may extend from the location proximate to the main PCB 260 through the opening 242 in the yoke 232 and into the cavity 271. A horizontal trace 275B of the antenna 275 may extend from the location proximate to the main PCB 260 through the opening 242 in the yoke 232 and into the cavity 271. The horizontal trace 275B may be connected to a vertical trace 275A of the antenna 275. The vertical trace 275A may be located within the cavity 271 (e.g., entirely within the cavity 271) when the antenna PCB 270 is attached to the main PCB 260.

When the control device 200 is mounted in a metal wallbox, the yoke 232 and the metal wallbox may form a shielded volume around the electrical circuitry on the main PCB 260 (e.g., including the wireless communication circuit). Locating the portion of the antenna 275 within the cavity 271 may allow the vertical trace 275A to be positioned in front of the yoke 232 (e.g., between the yoke 232 and the actuation member 210), for example, to allow electrical fields to be generated by and/or received by the antenna 275 and to help avoid interference with metal portions of the control device 200 (e.g., the yoke 232 and/or a metal faceplate). The material (e.g., substrate) of the antenna PCB 270 proximate to the antenna 275 may introduce loss and decrease performance of the antenna 275. The antenna PCB 270 may define slot(s) 274, 276 proximate to the antenna 275. The slots(s) 274, 276 may be located within the cavity 271 when the antenna PCB 270 is attached to the main PCB 260. The slot(s) 274, 276 may be configured to reduce an amount of board material proximate to the antenna 275 such that the performance of the antenna 275 is improved. The slot(s) 274, 276 may extend through the antenna PCB 270. For example, the slot(s) 274, 276 may extend from the first surface 261 of the antenna PCB 270 to the second surface 263 of the antenna PCB 270.

The antenna PCB 270 may be located proximate to a vertical midpoint of the control device 200, for example, so that the antenna 275 is located proximate to the pivot axis 222 of the actuation member 210. For example, at least a portion of the antenna 275 may be aligned with the pivot axis 222. When the antenna 275 is located proximate to the pivot axis 222, interference with the yoke 232 and/or other metal surfaces may be reduced (e.g., minimized). The antenna 275 may be located as far as possible from the capacitive touch PCB 240 and bidirectional semiconductor switch 268. For example, the antenna PCB 270 may be located substantially at a midpoint between the capacitive touch PCB 240 and the bidirectional semiconductor switch 268, for example, to avoid interference. The antenna PCB 270 may be located outside of a capacitive touch area, for example, defined by the capacitive touch regions A-E shown in FIG. 9.

The main PCB 260 may include one or more ground planes. For example, the main PCB 260 may include a ground plane 266 that is located on the main PCB 260 (e.g., a front side of the main PCB 260). The antenna 275 may extend perpendicularly from the main PCB 260 (e.g., the ground plane 266). For example, the ground plane 266 may be configured as a counterpoise for the antenna 275. The counterpoise for the antenna 275 may be located on the main PCB 260. The ground plane 266 may be located within the control device 200 (e.g., inside of the yoke 232, the enclosure ring 280, and the rear enclosure 230), such that the counterpoise for the antenna 275 may be located on an opposite side of the yoke 232 than the vertical trace 275A of the antenna 275 (e.g., the counterpoise may be submerged in the wallbox in which the control device 200 is installed). The second portion 242A of the opening 242 in the yoke 232 may be located over the ground place 266. The second portion 242A of the opening 242 may allow electrical fields to be generated by and/or received by the antenna 275.

The antenna 275 may be a bent pole antenna. For example, the antenna 275 may include a horizontal trace 275B and a vertical trace 275A. The antenna PCB 270 and the vertical trace 275A may be configured such that the antenna 275 is as close to vertical midpoint of the control device 200 (e.g., which may be defined by the pivot axis 222) as possible (e.g., without causing interference with the actuation member 210 and/or the capacitive touch PCB 240). The horizontal trace 275B may extend from the finger 272B to the vertical trace 275A. The finger 272B may be configured to connect the antenna 275 to the wireless communication circuit on the main PCB 260. The vertical trace 275A may have a width L3 and the horizontal trace 275B may have a width L4. The width L3 may be greater than the width L4. The width L3 of the vertical trace 275A may be sized to maximize the amount of the antenna 275 in front of the yoke 232, for example, as shown in FIGS. 6 and 7. Maximizing the amount of the antenna 275 in front of the yoke 232 may mitigate interference and increase bandwidth capabilities of the antenna 275. The antenna PCB 270 may comprise pads 278 that are configured to attach (e.g., mount) the antenna PCB 270 to the main PCB 260. For example, the pads 278 may be located on fingers 272A, 272C. It should be appreciated that the vertical trace 275A and the horizontal trace 275B of the antenna 275 are not limited to the geometry shown in FIG. 10. In examples, the width L4 of the horizontal trace 275B may be reduced and the width L3 of the vertical trace 275A may be increased. It should also be appreciated that although the figures show the antenna 275 on the second surface 273, the antenna 275 may be on the first surface 271 of the antenna PCB 270.

FIG. 11 is a simplified block diagram of an example control device 300 (e.g., a dimmer switch) that may be deployed as, for example, the dimmer switch 110 of the lighting control system 100 shown in FIG. 1 and/or the control device 200 shown in FIGS. 2-9. The control device 300 may include a hot terminal H that may be adapted to be coupled to an AC power source 302. The control device 300 may include a dimmed hot terminal DH that may be adapted to be coupled to an electrical load, such as a lighting load 304. The control device 300 may include a controllably conductive device 310 coupled in series electrical connection between the AC power source 302 and the lighting load 304. The controllably conductive device 310 may control the power delivered to the lighting load. The controllably conductive device 310 may include a suitable type of bidirectional semiconductor switch (e.g., such as the bidirectional semiconductor switch 268 shown in FIG. 9), such as, for example, a triac, a field-effect transistor (FET) in a rectifier bridge, two FETs in anti-series connection, or one or more insulated-gate bipolar junction transistors (IGBTs). An air-gap switch 329 may be coupled in series with the controllably conductive device 310. The air-gap switch 329 may be opened and closed in response to actuations of an air-gap actuator (e.g., not shown). When the air-gap switch 329 is closed, the controllably conductive device 310 is operable to conduct current to the load. When the air-gap switch 329 is open, the lighting load 304 is disconnected from the AC power source 302.

The control device 300 may include a dimmer control circuit 314. The dimmer control circuit 314 may include one or more of a processor (e.g., a microprocessor), a microcontroller, a programmable logic device (PLD), a field programmable gate array (FPGA), an application specific integrated circuit (ASIC), or any suitable controller or processing device. The dimmer control circuit 314 may be operatively coupled to a control input of the controllably conductive device 310, for example, via a gate drive circuit 312. The dimmer control circuit 314 may be used for rendering the controllably conductive device 310 conductive or non-conductive, for example, to control the amount of power delivered to the lighting load 304. The dimmer control circuit 314 may receive a control signal representative of the zero-crossing points of the AC mains line voltage of the AC power source 302 from a zero-crossing detector 316. The dimmer control circuit 314 may be operable to render the controllably conductive device 310 conductive and/or non-conductive at predetermined times relative to the zero-crossing points of the AC waveform using a phase-control dimming technique. The dimmer control circuit 314 may be configured to control the magnitude of a load current conducted through the lighting load(s) so as to control an intensity level of the lighting load 304 across a dimming range between a low-end intensity level $L_{LE}$ and a high-end intensity level $L_{HE}$. For example, the dimmer control circuit 314 may be configured to control the intensity level of the lighting load 304 to a number $N_{INT}$ (e.g., 255) of intensity levels between the low-end intensity level $L_{LE}$ and the high-end intensity level $L_{HE}$.

The control device 300 may include a memory 318. The memory 318 may be communicatively coupled to the dimmer control circuit 314 for the storage and/or retrieval of, for example, operational settings, such as, lighting presets and associated preset light intensities. The memory 318 may be implemented as an external integrated circuit (IC) or as an internal circuit of the dimmer control circuit 314. The control device 300 may include a power supply 320. The power supply 320 may generate a direct-current (DC) supply voltage $V_{CC}$ for powering the dimmer control circuit 314 and the other low-voltage circuitry of the control device 300. The power supply 320 may be coupled in parallel with the controllably conductive device 310. The power supply 320 may be operable to conduct a charging current through the lighting load 304 to generate the DC supply voltage $V_{CC}$.

The dimmer control circuit 314 may be responsive to user inputs received from actuators 330 and/or a touch sensitive device 350. It should be appreciated that in examples where the control device is a dual-dimmer, the control device may include two touch sensitive devices 350 or a single touch sensitive device that is responsive to two sets of capacitive touch elements, such as capacitive touch pads. The dimmer control circuit 314 may control the controllably conductive device 310 to adjust the intensity level of the lighting load 304 in response to the user inputs (e.g., tactile actuations and/or touch actuations) received via the actuators 330 and/or the touch sensitive device 350. The dimmer control circuit 314 may receive respective actuator signals from the actuators 330 in response to tactile actuations of the actuators 330 (e.g., in response to movements of the actuators 330). For example, the actuators 330 may be actuated in response to tactile actuations of an upper portion and/or a lower portion of the actuation member of the control device.

The touch sensitive device 350 may be configured to detect touch actuations (e.g., point actuations and/or gestures, where, for example, the gestures may be effectuated with or without physical contacts with the touch sensitive device 350), and provide respective one or more output signals $V_{OUT}$ to the dimmer control circuit 314 indicating the touch actuations (e.g., indicating a position of one or more touch actuations). The touch sensitive device 350 may detect a touch actuation of the front surface along the light bar and cause the dimmer control circuit 314 to adjust the amount of power delivered to the lighting load 304 accordingly. The dimmer control circuit 314 may be configured to translate the actuator signals received from the actuators 330 and/or the output signals $V_{OUT}$ received from the touch sensitive device 350 into control data (e.g., one or more control signals). The control circuit 314 may use the control data to drive a drive circuit 312 to control a controllably conductive device 310 to adjust the amount of power delivered to the lighting load 304 and/or cause the control data to be transmitted to the lighting load 304 or a central controller of the load control system.

The touch sensitive device 350 may include a capacitive touch circuit 352 and a user interface control circuit 354 (e.g., which may be an example of the capacitive touch controller). The capacitive touch circuit 352 that comprises one more capacitive touch elements. For example, the capacitive touch circuit 352 may comprise one or more capacitive touch pads, such as the receiving capacitive touch pads 244 mounted to the capacitive touch PCB 240 of the control device 200. In addition, the capacitive touch circuit 352 may comprise one or more capacitive transmission traces 245. The capacitive touch circuit 352 may provide one or more capacitive receive signals $V_{RX-A}$-$V_{RX-E}$ from the capacitive touch pads of the capacitive touch circuit 352 (e.g., from regions A-E of the receiving capacitive touch pads 244 mounted to the capacitive touch PCB 240 of the control device 200), where each capacitive receive signal $V_{RX-A}$-$V_{RX-E}$ indicates the capacitance of a capacitive touch pad.

The user interface control circuit 354 may include one or more of a processor (e.g., a microprocessor), a microcontroller, a programmable logic device (PLD), a field programmable gate array (FPGA), an application specific integrated circuit (ASIC), or any suitable controller or processing device. The user interface control circuit 354 may include a memory and/or may use the memory 318. The user interface control circuit 354 may be configured to determine or detect a change in the capacitances of the capacitive touch pads of the capacitive touch circuit 352 (e.g., due to a user's finger actuating the front surface 214 of the actuation member 210), and generate the output signal $V_{OUT}$ in accordance with the change in capacitance of the capacitive touch pads. The output signal $V_{OUT}$ may indicate a position of a touch actuation along the front surface of the actuation member (e.g., over the light bar 220). As noted above, the user interface control circuit 354 may receive one or more capacitive receive signals $V_{RX-A}$-$V_{RX-E}$ from the capacitive touch pads of the capacitive touch circuit 352 (e.g., from regions A-E of the receiving capacitive touch pads 244 mounted to the capacitive touch PCB 240 of the control device 200), where each capacitive receive signal $V_{RX-A}$-$V_{RX-E}$ indicates the capacitance of a capacitive touch pad.

The user interface control circuit 354 may be configured to determine the position of the touch actuation along the front surface of the actuation member (e.g., along the light bar 220) in response to the receive signals $V_{RX-A}$-$V_{RX-E}$ generated by the receiving capacitive touch pads. In response, the user interface control circuit 354 may generate and provide the output signal $V_{OUT}$ to the dimmer control circuit 314. For example, the user interface control circuit 354 may be configured to charge capacitances of the capacitive touch pads of the capacitive touch circuit 352. For example, although not illustrated, the capacitive touch pads of the capacitive touch circuit 352 may be coupled to user interface control circuit 354 via a capacitive transmitting circuit (not shown) and/or a capacitive receiving circuit (not shown). The user interface control circuit 354 may be configured to control the capacitive transmitting circuit to charge capacitances of the capacitive touch pads (e.g., the capacitive touch pads 244) of the capacitive touch circuit 352. For example, the capacitive transmitting circuit may be configured to control a capacitive transmitting signal $V_{TX}$ to pull the transmission traces (e.g., the transmission traces 245) of the capacitive touch circuit 352 up towards the supply voltage $V_{CC}$ to charge the capacitances of the capacitive touch pads.

The user interface control circuit 354 may step through each of the capacitive touch pads of the capacitive touch circuit 352 and process the capacitive receive signals $V_{RX-A}$-$V_{RX-E}$ to detect a change in the capacitance of the respective capacitive touch pad. For example, the user interface control circuit 354 may periodically charge the capacitance of each of the capacitive touch pads of the capacitive touch circuit 352 and then discharge the capacitance of the respective touch pad into a capacitor (not shown) of the user interface control circuit 354 (e.g., which may have a much larger capacitance than the capacitance of each of the capacitive touch pads of the capacitive touch circuit 352). The user interface control circuit 354 may be configured to compare the voltage across the capacitor of the touch sensitive device 350 to a voltage threshold $V_{TH}$ and generate an output signal $V_{OUT}$, which may indicate when the voltage across the capacitor of the touch sensitive device 350 exceeds the voltage threshold $V_{TH}$. For example, the user interface control circuit 354 may charge and discharge the capacitance of each capacitive touch pad a predetermined number of time (e.g., 500 times) during a sensing interval (e.g., 500 μsec) before moving on the next capacitive touch pad of the capacitive touch circuit 352. The user interface control circuit 354 may be configured to compare a measured voltage provided via one or more of the capacitive touch pads to a voltage threshold. The user interface control circuit 354 may generate an output signal that indicates when the measured voltage exceeds the voltage threshold. The user interface control circuit 354 may be configured to use different voltage thresholds for different capacitive touch pads. For example, the capacitive touch pads may be separated from the touch sensitive surface by varying distances and the different voltage thresholds used may be based on the distance(s) between the capacitive touch pads and the touch sensitive surface.

The user interface control circuit 354 may be configured to determine a count $N_{CAP}$ that indicates how many times the capacitance of the respective capacitive touch pad was charged and discharged before the voltage across the capacitor of the touch sensitive device 350 exceeds the voltage threshold $V_{TH}$. The count $N_{CAP}$ may indicate the present capacitance of the respective capacitive touch pad of the capacitive touch circuit 352. The count $N_{CAP}$ for each of the capacitive touch pads of the capacitive touch circuit 352 may represent a sample of the present capacitance of the respective touch pad during the preceding sensing interval. The user interface control circuit 354 may be configured to process the count $N_{CAP}$ to determine the present capacitance of the respective touch pad of the capacitive touch circuit 352 using a respective baseline count $N_{BL}$ for each of the capacitive touch pads of the capacitive touch circuit 352. The baseline count $N_{BL}$ may indicate an idle capacitance of each of the capacitive touch pads when the front surface of the actuation member (e.g., the light bar) is not being actuated. The user interface control circuit 354 may be configured to determine the respective baseline counts $N_{BL}$ for each of the capacitive touch pads of the capacitive touch circuit 352 when the front surface of the actuation member is not being actuated. For example, the baseline count $N_{BL}$ may be a long-term average of the count $N_{CAP}$ determined by the user interface control circuit 354 from the capacitive receive signals $V_{RX-A}$-$V_{RX-E}$.

After stepping through each of the capacitive touch pads of the capacitive touch circuit 352 (e.g., after a round of capacitive sensing of the capacitive touch pads), the user interface control circuit 354 may process the determined counts $N_{CAP}$ for each of the respective capacitive touch pads of the capacitive touch circuit 352 to detect a touch actuation. The user interface control circuit 354 may be configured to determine a change $\Delta_{CAP}$ in the count (e.g., which may indicate the capacitance of each of the capacitive touch pad of the capacitive touch circuit 352) by determining the difference between the respective baseline count $N_{BL}$ from the present count $N_{CAP}$ of the respective capacitive touch pad, e.g., $\Delta_{CAP}=|N_{CAP}-N_{BL}|$. The user interface control circuit 354 may be configured to determine that capacitive sensitive surface (e.g., the light bar) is being actuated when at least one of the changes $\Delta_{CAP}$ in count exceeds a capacitance-change threshold $TH_{CAP}$, which may represent a 0.5% to 1% change in the capacitance, for example.

The user interface control circuit 354 may be configured to determine a number $N_{TOUCH-IN}$ of times (e.g., a number of consecutive rounds of capacitive sensing) that the change $\Delta_{CAP}$ in count for one of the capacitive touch pads exceeds the capacitance-change threshold $TH_{CAP}$. The user interface control circuit 354 may be configured to enter an active touch mode when the number $N_{TOUCH-IN}$ exceeds a touch-in threshold $TH_{TOUCH-IN}$ (e.g., such as two, three, four, five, six, seven, or eight). For example, the user interface control circuit 354 may detect a touch actuation when the number $N_{TOUCH-IN}$ exceeds a touch-in threshold $TH_{TOUCH-IN}$. When in the active touch mode, the user interface control circuit 354 may be configured to determine a number $N_{TOUCH-OUT}$ of times (e.g., a number of consecutive rounds of capacitive sensing) that the change $\Delta_{CAP}$ in count for one of the capacitive touch pads does not exceed the capacitance-change threshold $TH_{CAP}$. The user interface control circuit 354 may be configured to exit the active touch mode when the number $N_{TOUCH-OUT}$ exceeds a touch-out threshold $TH_{TOUCH-OUT}$.

While in the active touch mode, the user interface control circuit 354 may be configured to determine the position of the touch actuation along the touch sensitive surface (e.g., the light bar) in response to ratios of the changes $\Delta_{CAP}$ in the count for each of the capacitive touch pads of the capacitive touch circuit 352 (e.g., in response to the receive signals $V_{RX-A}$-$V_{RX-E}$ generated by the receiving capacitive touch pads). For example, the ratio of the change $\Delta_{CAP}$ in the count for region B to the change $\Delta_{CAP}$ in the count for region C of the receiving capacitive touch pads 244 of the control device 200 may indicate a position of a touch actuation along the light bar 220 between the regions B and C.

The user interface control circuit 354 may provide an output signal $V_{OUT}$ to the dimmer control circuit 314 in response to detecting a touch actuation along the touch sensitive surface of the control device 300 (e.g., in response to detecting a touch actuation along the light bar 220). The output signal $V_{OUT}$ may indicate a position of the touch along the front surface of the actuation member. The dimmer control circuit 314 may be configured to translate the output signal $V_{OUT}$ into control data (e.g., one or more control signals) for controlling one or more electrical loads. For example, the dimmer control circuit 314 may use the control data to drive a drive circuit 312 to control a controllably conductive device 310 to adjust the amount of power delivered to the lighting load 304 and/or may cause the control data to be transmitted to the lighting load 304, another load control device, and/or a system controller of the load control system via a communication circuit 322.

The user interface control circuit 354 may generate a touch actuation signal $V_{ACT}$ that may indicate that a touch is present along the touch sensitive surface of the actuation member of the control device. The user interface control circuit 354 may provide the touch actuation signal $V_{ACT}$ to the dimmer control circuit 314. For example, the user interface control circuit 354 may drive the touch actuation signal $V_{ACT}$ high upon detecting a touch actuation along the touch sensitive surface to indicate that the control device is operating in active touch mode, and otherwise drive the touch activation signal $V_{ACT}$ low.

Although described with reference to the user interface control circuit 354, it should be appreciated that in some examples the control device 300 may include a single control circuit, such as the dimmer control circuit 314, and the processing performed by the user interface control circuit 354 may be performed by the dimmer control circuit 314.

The control device 300 may comprise the wireless communication circuit 322. The wireless communication circuit 322 may include for example, a radio-frequency (RF) transceiver coupled to an antenna 324 (e.g., the antenna 275) for transmitting and/or receiving RF signals. The wireless communication circuit 322 may also include an RF transmitter for transmitting RF signals, an RF receiver for receiving RF signals, or an infrared (IR) transmitter and/or receiver for transmitting and/or receiving IR signals. The wireless communication circuit 322 may be configured to transmit a control signal that includes the control data (e.g., a digital message) generated by the dimmer control circuit 314 to the lighting load 304. For example, the wireless communication circuit 322 may be coupled to an antenna (e.g., such as antenna 275 shown in FIGS. 6, 7, and 10) for transmitting one or more messages to one or more lighting loads (e.g., lighting load 304) As described herein, the control data may be generated in response to a user input (e.g., a point actuation or a gesture) to adjust one or more operational aspects of the lighting load 304. The control data may include a command and/or identification information (e.g., such as a unique identifier) associated with the control device 300. In addition to or in lieu of transmitting the control signal to the lighting load 304, the wireless communication circuit 322 may be controlled to transmit the control signal to a central controller of the lighting control system.

The dimmer control circuit 314 may be configured to illuminate visual indicators 360 (e.g., LEDs) to provide feedback of a status of the lighting load 304, in response to receiving indications of actuations of capacitive touch pads, to indicate a status of the control device 300, and/or to assist with a control operation (e.g., to provide a color gradient for controlling the color of the lighting load 304, to present backlit virtual buttons for preset, zone, or operational mode selection, etc.). The visual indicators 360 may be configured to illuminate a light bar (e.g., the light bar 220) and/or to serve as indicators of various conditions. As one example, touch sensitive device 350 may be used to allow a user to control dimming of a lighting load, with visual indicators 360, through illumination of light bar 220, showing the degree of dimming (e.g., increased illumination of the light bar to show increased intensity of the load).

What is claimed is:

1. A control device configured to control one or more electrical loads, the control device comprising:
   an actuation member having a front surface defining a touch sensitive surface configured to detect a touch actuation along at least a portion of the touch sensitive surface;
   a metal yoke that is configured to attach the control device to a wallbox, the metal yoke defining an opening, wherein the control device defines a cavity between the actuation member and the metal yoke;
   a main printed circuit board having a first control circuit, a ground plane, and a wireless communication circuit mounted thereto, the main printed circuit board located on an opposite side of the metal yoke than the actuation member;
   a capacitive touch printed circuit board having one or more receiving capacitive touch pads mounted to the capacitive touch printed circuit board, behind the actuation member, wherein the main printed circuit board is responsive to inputs from the capacitive touch printed circuit board; and
   an antenna printed circuit board electrically connected to the main printed circuit board, the antenna printed circuit board having a monopole antenna mounted thereto, the monopole antenna extending substantially perpendicular from the main printed circuit board and through the opening such that a portion of the monopole antenna is located within the cavity,
   wherein the ground plane on the main printed circuit board is configured as a counterpoise for the monopole antenna, and
   wherein the wireless communication circuit is coupled to the monopole antenna for receiving messages that include one or more commands for controlling the one or more electrical loads.

2. The control device of claim 1, wherein the one or more receiving capacitive touch pads are arranged in a linear array adjacent to the touch sensitive surface.

3. The control device of claim 1, wherein the capacitive touch printed circuit board comprises a second control circuit configured to receive inputs from the capacitive touch pads and communicate with the first control circuit in response to the inputs received from the one or more receiving capacitive touch pads.

4. The control device of claim 1, wherein the wallbox is a metal wallbox, and wherein the metal wallbox and the metal yoke form a shielded volume around electrical circuitry on the main printed circuit board.

5. The control device of claim 1, wherein a tactile switch, a controllably conductive device, and a drive circuit are mounted to the main printed circuit board, the drive circuit operatively coupled to a control input of the controllably conductive device for rendering the controllably conductive device conductive or non-conductive to control an amount of power delivered to the one or more electrical loads, wherein the tactile switch is configured to be actuated in response to the actuation member pivoting, and wherein the control device is configured to turn the one or more electrical loads on or off in response to actuation of the tactile switch.

6. The control device of claim 3, wherein the first control circuit is configured to control an amount of power delivered to the one or more electrical loads in response to a position of the touch actuation along a length of the touch sensitive surface indicated by an output signal from the second control circuit.

7. The control device of claim 1, wherein the capacitive touch printed circuit board is affixed to the actuation member.

8. The control device of claim 7, wherein the actuation member is configured to pivot about a pivot axis in response to tactile actuations of the actuation member, and wherein the capacitive touch printed circuit board is configured to move with the tactile actuations of the actuation member.

9. The control device of claim 1, wherein the opening comprises a first portion that is configured to receive the antenna printed circuit board and a second portion that is configured to enable electrical connection of the capacitive touch printed circuit board to the main printed circuit board.

10. The control device of claim 9, wherein the first portion is longer than the second portion and the second portion is wider than the first portion.

11. The control device of claim 9, wherein the second portion is configured to receive a cable that connects the capacitive touch printed circuit board and the main printed circuit board.

12. The control device of claim 1, wherein the monopole antenna extends from a location proximate to the main printed circuit board through the opening in the metal yoke and into the cavity.

13. The control device of claim 12, wherein the monopole antenna is located substantially at a midpoint between the capacitive touch printed circuit board and a bidirectional semiconductor switch of the control device.

14. The control device of claim 13, wherein the monopole antenna is located outside of a capacitive touch area defined by the capacitive touch printed circuit board.

15. The control device of claim 1, further comprising a light pipe configured to conduct light emitted by one or more light sources mounted to the main printed circuit board to illuminate a light bar on the actuation member.

16. The control device of claim 15, wherein the light bar extends along a length of the actuation member, and wherein the touch sensitive surface of the front surface of the actuation member is arranged adjacent to the light bar.

17. The control device of claim 1, wherein the actuation member is configured to pivot about a pivot axis to actuate a tactile switch mounted to the main printed circuit board in response to tactile actuations of the actuation member.

18. The control device of claim 17, wherein at least a portion of the monopole antenna is aligned with the pivot axis.

19. The control device of claim 17, wherein the capacitive touch printed circuit board is configured to move with the actuation member in response to the tactile actuations of the actuation member.

20. The control device of claim 19, wherein the ground plane is configured to shield the capacitive touch pads and the monopole antenna from noise caused by the metal yoke of the control device when the capacitive touch printed circuit board moves with the actuation member in response to actuations of the actuation member.

21. The control device of claim 1, wherein the monopole antenna comprises;
a horizontal trace that extends from a front side of the metal yoke to a rear side of the metal yoke, and
a vertical trace connected to the horizontal trace, the vertical trace comprising the portion of the monopole antenna located within the cavity.

22. The control device of claim 21, wherein the vertical trace of the monopole antenna defines a first width and the horizontal trace of the monopole antenna defines a second width, and wherein the first width is greater than the second width.

23. The control device of claim 22, wherein the antenna printed circuit board comprises a plurality of fingers that are configured to connect the antenna printed circuit board to the main printed circuit board.

24. The control device of claim 23, wherein the monopole antenna is electrically connected to the wireless communication circuit via one of the plurality of fingers.

25. The control device of claim 23, wherein the antenna printed circuit board comprises pads on one or more of the plurality of fingers that are configured to attach the antenna printed circuit board to the main printed circuit board.

26. The control device of claim 25, wherein the main printed circuit board comprises a plurality of slots configured to receive the plurality of fingers.

27. The control device of claim 22, wherein the antenna printed circuit board comprises one or more slots proximate to the monopole antenna, the one or more slots configured to reduce an amount of board material proximate to the monopole antenna.

28. The control device of claim 27, wherein a first slot of the one or more slots is located proximate to the vertical trace of the monopole antenna and a second slot of the one or more slots is located proximate to the horizontal trace of the monopole antenna.

* * * * *